(12) United States Patent
Kim et al.

(10) Patent No.: US 7,635,436 B2
(45) Date of Patent: Dec. 22, 2009

(54) ETCHANT COMPOSITION AND MANUFACTURING METHOD FOR THIN FILM TRANSISTOR ARRAY PANEL

(75) Inventors: Kyu-Sang Kim, Gyeonggi-do (KR); Kwan-Tack Lim, Gyeonggi-do (KR)

(73) Assignee: Samsung Elctronics Co., Ltd., Suwon-Si (KR)

( * ) Notice: Subject to any disclaimer, the term of this patent is extended or adjusted under 35 U.S.C. 154(b) by 887 days.

(21) Appl. No.: 11/271,079

(22) Filed: Nov. 10, 2005

(65) Prior Publication Data

US 2006/0183338 A1    Aug. 17, 2006

(30) Foreign Application Priority Data

Feb. 15, 2005    (KR) ...................... 10-2005-0012285

(51) Int. Cl.
*G02F 1/1333* (2006.01)

(52) U.S. Cl. .............................. 216/23; 216/24; 216/83; 216/95; 216/100; 216/101; 216/108; 438/99; 438/151

(58) Field of Classification Search ........................ None
See application file for complete search history.

(56) References Cited

U.S. PATENT DOCUMENTS

| | | | |
|---|---|---|---|
| 4,238,279 A | * | 12/1980 | Tsubai et al. ............... 216/108 |
| 6,433,842 B1 | | 8/2002 | Kankeo et al. |
| 2004/0055997 A1 | * | 3/2004 | Park et al. ...................... 216/9 |
| 2004/0056251 A1 | * | 3/2004 | Kim et al. ...................... 257/72 |
| 2006/0076562 A1 | * | 4/2006 | Lee et al. ...................... 257/72 |
| 2007/0029280 A1 | * | 2/2007 | Lee et al. ...................... 216/41 |

FOREIGN PATENT DOCUMENTS

| | | |
|---|---|---|
| JP | 2001-166336 | 6/2001 |
| JP | 2002-111004 | 4/2002 |
| JP | 2002-299630 | 10/2002 |
| JP | 2003-273109 | 9/2003 |
| JP | 2004-093746 | 3/2004 |
| JP | 2004-163901 | 6/2004 |
| KR | 100321227 | 1/2002 |
| KR | 1020030041694 | 5/2003 |
| KR | 100415700 | 7/2004 |
| KR | 100444345 | 8/2004 |
| KR | 1020040080963 | 9/2004 |

* cited by examiner

*Primary Examiner*—Anita K Alanko
(74) *Attorney, Agent, or Firm*—F. Chau & Associates, LLC

(57) ABSTRACT

The present invention provides an etchant composition containing 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

12 Claims, 30 Drawing Sheets

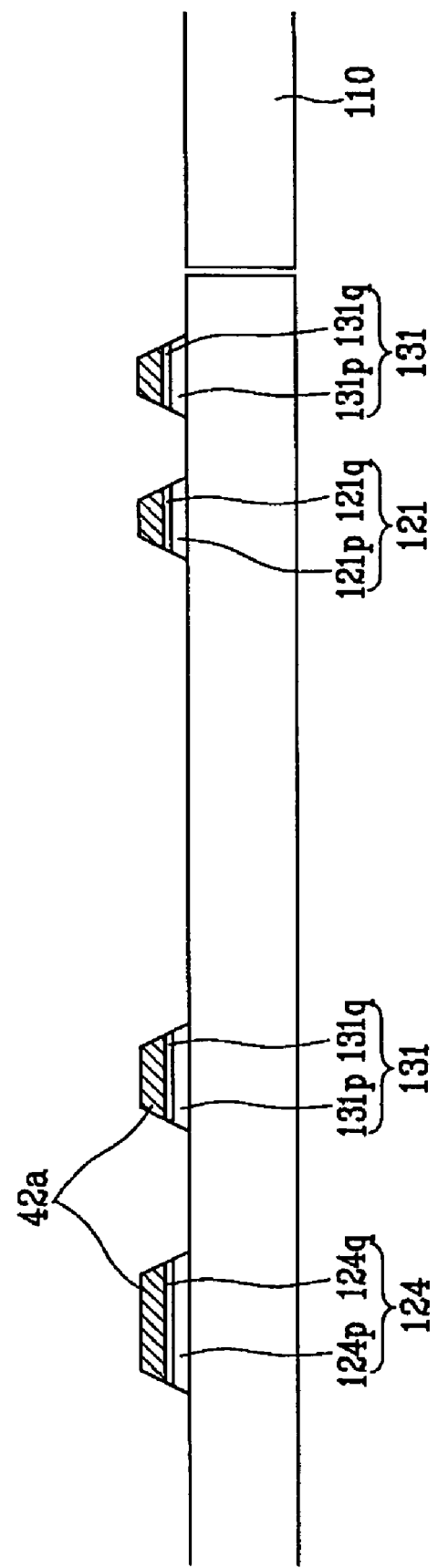

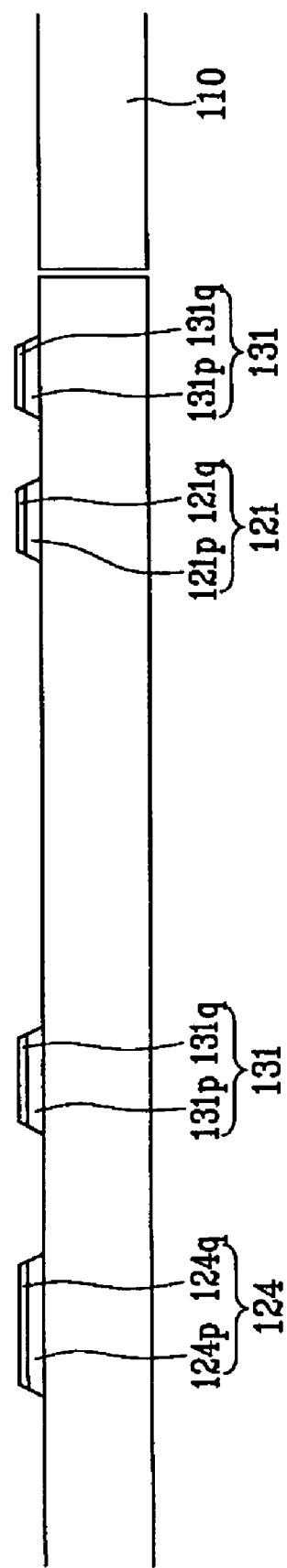

US 7,635,436 B2

ETCHANT COMPOSITION AND MANUFACTURING METHOD FOR THIN FILM TRANSISTOR ARRAY PANEL

BACKGROUND OF THE INVENTION (a) Field of the Invention

The present description relates to an etchant composition and a manufacturing method of a thin film transistor (TFT) array panel using the same.

(b) Description of the Related Art

Liquid crystal displays (LCDs) are one of the most widely used flat panel displays. An LCD includes a liquid crystal (LC) layer interposed between two panels provided with field-generating electrodes. The LCD displays images by applying voltages to the field-generating electrodes to generate an electric field in the LC layer that determines orientations of LC molecules in the LC layer to adjust polarization of incident light.

Currently, the LCD market is dominated by LCDs which include two panels provided with field-generating electrodes, wherein one panel has a plurality of pixel electrodes in a matrix and the other has a common electrode covering the entire surface of the panel.

The LCD displays images by applying a different voltage to each pixel electrode. For this purpose, thin film transistors (TFTs), having three terminals to switch voltages applied to the pixel electrodes, are connected to the pixel electrodes, and gate lines to transmit signals for controlling the thin film transistors and data lines to transmit voltages applied to the pixel electrodes are formed on a thin film transistor array panel.

A TFT is a switching element for transmitting the image signals from the data wire to the pixel electrode in response to the scanning signals from the gate wire.

The TFT is applied to an active matrix organic light emitting display (OLED) as a switching element for controlling respective light emitting elements.

When the increasing size trend of LCDs and OLEDs is considered, a material having low resistivity is urgently required since the lengths of the gate and data lines increase along with the LCD size and OLED size.

However, a material having low resistivity has disadvantages such as poor contact property with other materials and weak resistance against chemicals. To overcome these obstacles, multi-layered signal lines are proposed.

However, multi-layered signal lines also have problems. Profile degradation of signal lines, such as undercut or overhang is induced due to a difference in etching speed between layers of different materials and a galvanic effect induced when two different metals contact.

SUMMARY OF THE INVENTION

The present invention provides an etchant composition that does not induce profile degradation of signal lines. The present invention also provides a manufacturing method of a TFT array panel using the etchant composition.

The present invention provides an etchant composition containing phosphoric acid ($H_3PO_4$), nitric acid ($HNO_3$), acetic acid ($CH_3COOH$), and aluminum nitrate ($Al(NO_3)_3$).

In detail, the etchant composition contains 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

The etchant may further comprise a surfactant.

The present invention further provides a manufacturing method of a TFT array panel comprising: forming a gate line made of a conductive material on an insulating substrate; forming a gate insulating layer on the gate line; forming a semiconductor layer having a predetermined pattern on the gate insulating layer; forming a data line and drain electrode made of a conductive material on the semiconductor layer; and forming a pixel electrode connected to the drain electrode, wherein at least one of the formation of the gate line, the formation of the data line and drain electrode, and the formation of the pixel electrode comprises an photo-etching with an etchant containing phosphoric acid ($H_3PO_4$), nitric acid ($HNO_3$), acetic acid ($CH_3COOH$), and aluminum nitrate ($Al(NO_3)_3$).

BRIEF DESCRIPTION OF THE DRAWINGS

The above and other features and advantage points of the present invention will become more apparent by describing in detailed embodiments thereof with reference to the accompanying drawings, in which:

FIGS. 3 to 5, 6B, 7B to 10, 11B, and 12B are sectional views sequentially illustrating the intermediate steps of a method of manufacturing a TFT array panel for an LCD according to the embodiment of FIGS. 1 and 2

FIGS. 15 to 17, 18B, 19 to 21, and 22B are sectional views sequentially illustrating the intermediate steps of a method of manufacturing a TFT array panel for an LCD according to the embodiment of FIGS. 13 and 14

DETAILED DESCRIPTION OF THE PREFERRED EMBODIMENTS

Figure 1:
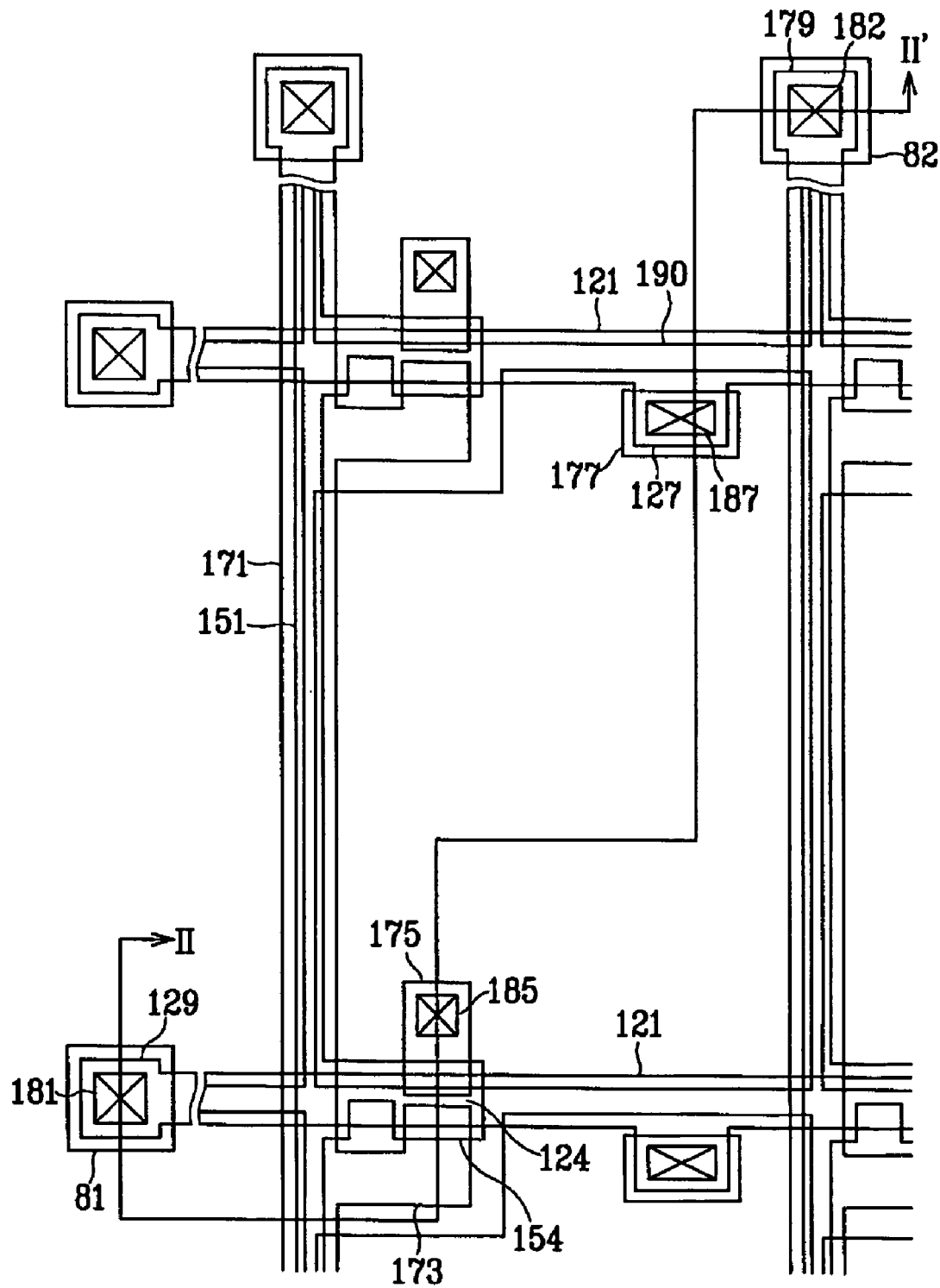
FIG. 1 is a layout view of a TFT array panel for an LCD according to an embodiment of the present invention.

Henceforth, preferred embodiments of the present invention will be described more fully with reference to the accompanying drawings, in which preferred embodiments of the invention are shown. The present invention may, however, be embodied in different forms and should not be construed as being limited to the embodiments set forth herein. Rather, these embodiments are provided so that this disclosure will be thorough and complete, and will fully convey the scope of the invention to those skilled in the art.

In the drawings, the thickness of layers, films, and regions are exaggerated for clarity. Like numerals refer to like elements throughout. It will be understood that when an element such as a layer, film, region, or substrate is referred to as being "on" another element, it can be directly on the other element or intervening elements may also be present.

Embodiments 1

A manufacturing method of a TFT array panel according to an embodiment of the present invention will be described in detail with reference to the accompanying drawings such that a person of ordinary skill in the art can easily carry out the invention.

Figure 2:
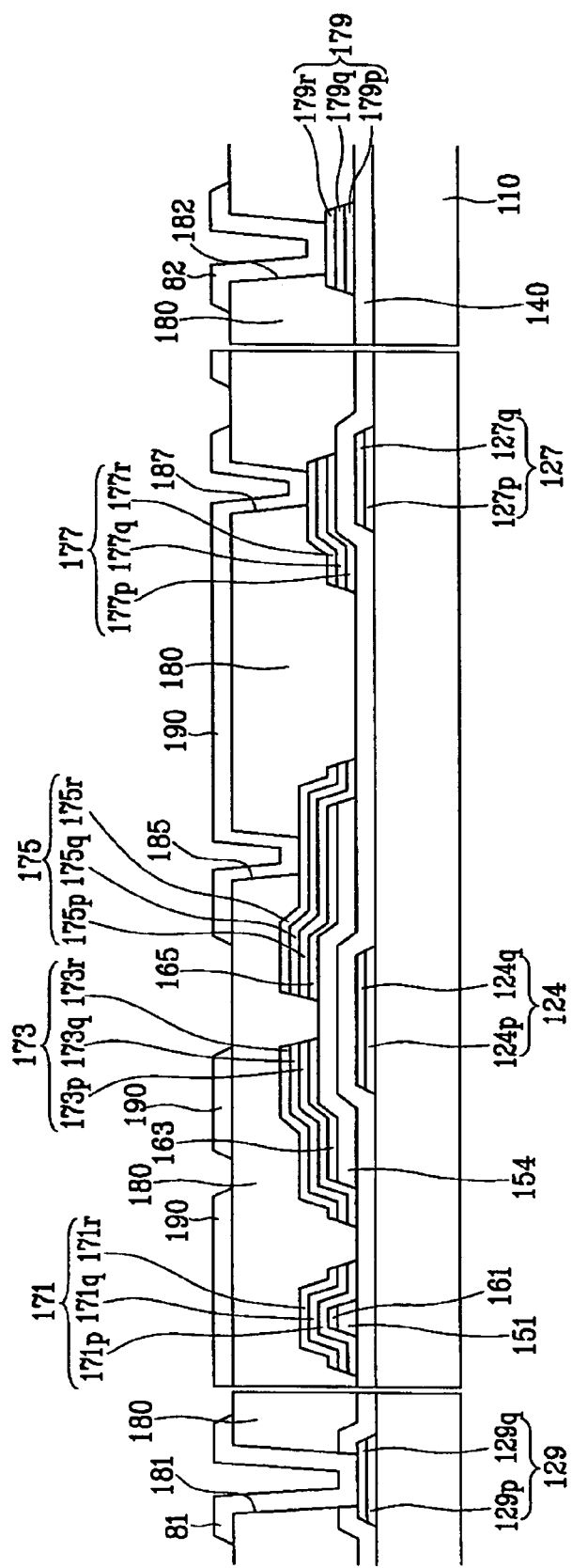
FIG. 2 is a sectional view of the TFT array panel shown in FIG. 1 taken along the line II-II.

FIG. 1 is a layout view of a TFT array panel for an LCD according to an embodiment of the present invention, and FIG. 2 is a sectional view of the TFT array panel shown in FIG. 1 taken along the line II-II.

A plurality of gate lines 121 for transmitting gate signals are formed on an insulating substrate 110. The gate lines 121 are mainly formed in the horizontal direction, and partial portions thereof become a plurality of gate electrodes 124. Also, different partial portions thereof that extend in a lower direction become a plurality of expansions 127.

The gate line 121 has lower layers 124p, 127p and upper layers 124q, 127q. The lower layers 124p, 127p are made of an Al-containing metal such as aluminum (Al) or aluminum-neodymium (Al—Nd). The upper layers 124q, 127q are made one of molybdenum (Mo), a Mo-alloy containing MO and one material selected from niobium (Nb), tungsten (W), tantalum (Ta), chromium (Cr), and molybdenum nitride (MoN)

The lateral sides of the upper layers 124q, 127q and lower layers 124p, 127p are inclined relative to a surface of the substrate 110, and the inclination angle thereof ranges from about 30 to 80 degrees.

A gate insulating layer 140 preferably made of silicon nitride (SiNx) is formed on the gate lines 121.

A plurality of semiconductor stripes 151, preferably made of hydrogenated amorphous silicon (herein referred to as "a-Si"), are formed on the gate insulating layer 140. Each semiconductor stripe 151 extends substantially in the longitudinal direction and is curved periodically. Each semiconductor stripe 151 has a plurality of projections 154 branched out toward the gate electrodes 124. The width of each semiconductor stripe 151 becomes large near the gate lines 121 such that the semiconductor stripe 151 covers large areas of the gate lines 121.

A plurality of ohmic contact stripes 161 and islands 165, preferably made of silicide or n+ hydrogenated a-Si heavily doped with an n-type impurity, are formed on the semiconductor stripes 151. Each ohmic contact stripe 161 has a plurality of projections 163, and the projections 163 and the ohmic contact islands 165 are located in pairs on the projections 154 of the semiconductor stripes 151.

The edge surfaces of the semiconductor stripes 151 and the ohmiccontacts 161, 165 are tapered, and the inclination angles of the edge surfaces of the semiconductor stripes 151 and the ohmic contacts 161, 165 are preferably in a range of about 30 to 80 degrees.

A plurality of data lines 171, a plurality of drain electrodes 175, and a plurality of storage capacitor conductors 177 are formed on the ohmic contacts 161, 165 and the gate insulating layer 140.

The data lines 171, for transmitting data voltages, extend substantially in the longitudinal direction and intersect the gate lines 121 to define pixel areas arranged in a matrix. A plurality of branches of each data line 171, which project toward the drain electrodes 175, form a plurality of source electrodes 173. Each pair of the source electrodes 173 and the drain electrodes 175 are separated from each other on the gate electrodes 124, and oppose each other.

The data line 171, the drain electrode 175, and the storage capacitor conductor 177 have first layers 171p, 175p, 177p, second layers 171q, 175q, 177q, and third layers 171r, 175r, 177r. The first layers 171p, 175p, 177p and the third layers 171r, 175r, 177r are respectively disposed at lower and upper sides of the second layers 171q, 175q, 177q. The first layers 171p, 175p, 177p and the third layers 171r, 175r, 177r are made of a Mo-containing metal. The second layers 171q, 175q, 177q are made of an Al-containing metal.

Since the Al or Al-alloy layer, which has low resistivity, is disposed between the two Mo-alloy layers, the data line 171 has low resistivity and the Al or Al-alloy layer is prevented from contacting the semiconductor and pixel electrodes that may cause poor contact. Accordingly, degradation of TFTs caused by poor contact is efficiently prevented.

With consideration of low resistance of signal line, prevention of diffusion, and avoidance of increasing contact resistance, the first to third metal layers respectively have thickness of 200 to 1,000 Å, 2,000 to 4,000 Å, and 200 to 1,000 Å.

The data lines 171, the drain electrodes 175, and the storage capacitor conductor 177 have tapered edge surfaces, and the inclination angles of the edge surfaces are in a range from about 30 to 80 degrees.

A gate electrode 124, a source electrode 173, and a drain electrode 175, along with a projection 154 of a semiconductor stripe 151, form a TFT This TFT has a channel formed in the projection 154 disposed between the source electrode 173 and the drain electrode 175. The storage capacitor conductor 177 is overlapped with the expansion 127 of the gate line 121.

The ohmic contact stripes 161, 165 are only interposed between the semiconductor stripe 151 and the data line 171 and between the drain electrode 175 and the projection 154 of the semiconductor stripe 151 in order to reduce contact resistance therebetween. The semiconductor stripe 151 is partially exposed at the place between the source electrode 173 and the drain electrode 175 and at other places not covered with the data line 171 and the drain electrode 175. Most of the semiconductor stripe 151 is narrower than the data line 171, but the width of the semiconductor stripe 151 broadens near a place where the semiconductor stripe 151 and the gate line 121 meet each other in order to prevent disconnection of the data line 171.

On the data line 171, the drain electrode 175, the storage capacitor conductor 177, and the exposed region of the semiconductor stripe 151, a passivation layer 180 is provided, which is made of an organic material having substantial planarization properties and photosensitivity or an insulating material with a low dielectric constant such as a-Si:C:O, a Si:O:F, etc. This passivation layer 180 is formed by plasma enhanced chemical vapor deposition (PECVD). To prevent the organic material of the passivation layer 180 from contacting with the semiconductor stripes 151 exposed between the data line 171 and the drain electrode 175, the passivation layer 180 can be structured in such a way that an insulating layer made of SiNx or $SiO_2$ is additionally formed under the organic material layer.

In the passivation layer 180, a plurality of contact holes 181, 185, 187, 182 are formed to expose an end portion 129 of the gate line 121, the drain electrode 175, the storage capacitor conductor 177, and an end portion 179 of the data line 171, respectively.

A plurality of pixel electrodes 190 and a plurality of contact assistants 81, 82, which are made of indium tin oxide (ITO) or indium-doped zinc oxide (IZO), are formed on the passivation layer 180.

Since the pixel electrode 190 is physically and electrically connected with the drain electrode 175 and the storage capacitor conductor 177 through the contact holes 185, 187, respectively, the pixel electrode 190 receives the data voltage from the drain electrodes 175 and transmits it to the storage capacitor conductor 177.

The pixel electrode 190 to which the data voltage is applied generates an electric field with a common electrode (not illustrated) of the opposite panel (not illustrated) to which a common voltage is applied, so that the liquid crystal molecules in the liquid crystal layer are rearranged.

Also, as mentioned above, the pixel electrode 190 and the common electrode form a capacitor to store and preserve the received voltage after the TFT is turned off. This capacitor will be referred to as a "liquid crystal capacitor." To enhance the voltage storage ability, another capacitor is provided, which is connected with the liquid crystal capacitor in parallel and will be referred to as a "storage capacitor." The storage capacitor is formed at an overlapping portion of the pixel electrode 190 and the adjacent gate line 121, which will be referred to as a "previous gate line." The expansion 127 of the gate line 121 is provided to ensure the largest possible overlap dimension and thus to increase storage capacity of the storage capacitor. The storage capacitor conductor 177 is connected to the pixel electrode 190 overlaps the expansion 127, and is provided at the bottom of the passivation layer 180 so that the pixel electrode 190 becomes close to the previous gate line 121.

In some embodiments, the pixel electrode 190 may overlap the adjacent gate line 121 and the adjacent data line 171 to enhance the aperture ratio.

The contact assistants 81, 82 supplement adhesion between the end portions 129, 179 of the gate line 121 and the data line 171 and the exterior devices, such as the driving integrated circuit. In addition, the contact assistants 81, 82 may provide protection. Applying the contact assistants 81, 82 is optional since it is not an essential element of the TFT array.

A method of manufacturing a TFT array panel will now be described in detail with reference to FIGS. 3 to 12B as well as FIGS. 1 and 2.

Figure 3:
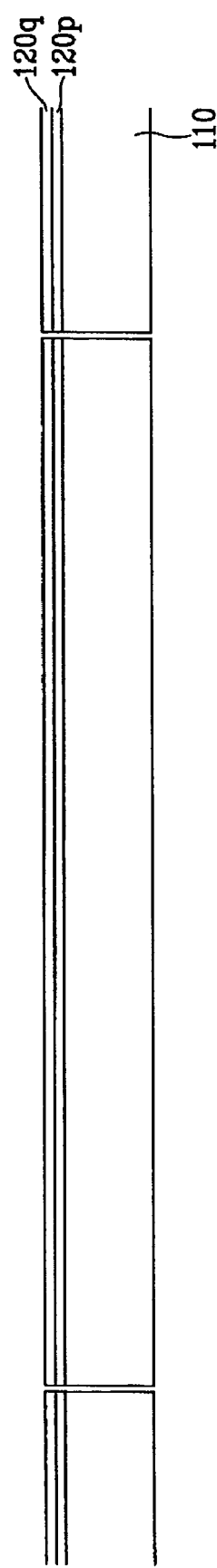

As shown in FIG. 3, a lower metal layer 120$p$ of Al—Nd and an upper metal layer 120$q$ of Mo are sequentially deposited on an insulating substrate 110. The lower and upper metal layers 120$p$ and 120$q$ are deposited by co-sputtering.

The co-sputtering is performed as follows.

Two targets are installed in the same sputtering chamber for the co-sputtering. One target is made of Al—Nd which contains 2 wt % of Nd, and the other target is made of molybdenum (Mo).

At first, power is applied to the Al—Nd target while no power is applied to the Mo target to deposit the lower layer 120$p$ of Al—Nd. The thickness of the lower layer 120$p$ is preferably 2,500 Å but may be a value selected from 1,000 to 5,000 Å.

Next, power is switched so that it is applied to the Mo-alloy target and not to the Al (or Al—Nd) target to deposit an upper layer 120$q$. The thickness of the upper layer 120$q$ is preferably 1,000 Å but may be a value selected from 50 to 2,000 Å.

Figure 4:
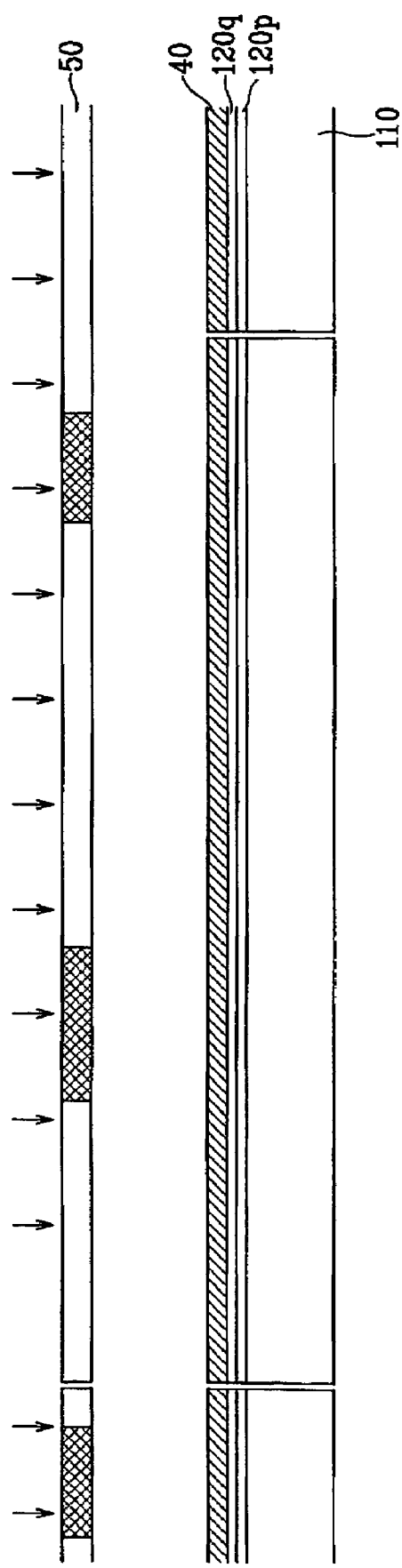

Next, as shown in FIG. 4, a photoresist layer 40 is coated on the second metal layer 120$b$ and is exposed to a light through a photomask 50. Then, the photoresist layer 40 is developed.

Figure 5:
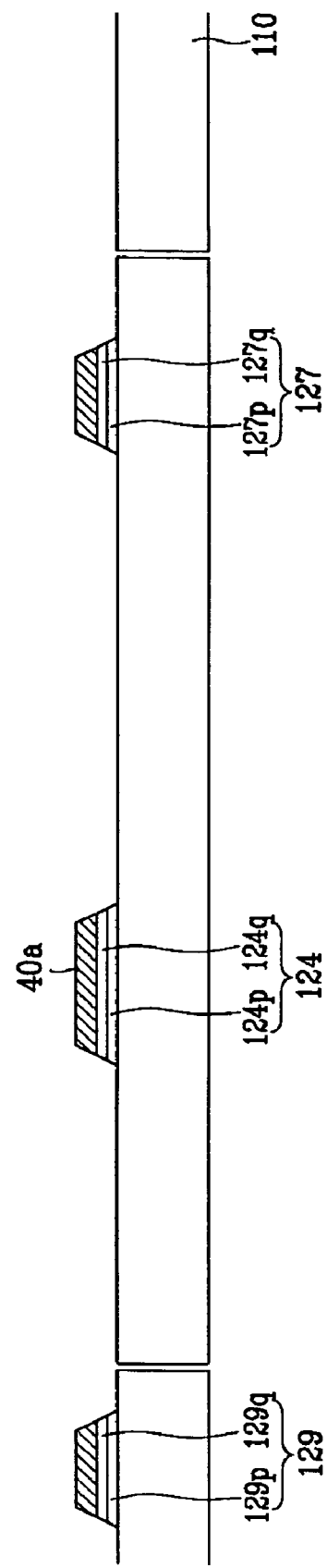

Next, as shown in FIG. 5, portions of the second metal layer 120$b$ and the first metal layer 120$a$, which are not covered by the photoresist pattern 40$a$, are etched with an etchant.

The etchant contains phosphoric acid ($H_3PO_4$), nitric acid ($HNO_3$), acetic acid ($CH_3COOH$), and aluminum nitrate ($Al(NO_3)_3$). The etchant preferably contains 60 to 75 wt % of phosphoric acid ($H_3PO_4$), 0.5 to 15 wt % of nitric acid ($HNO_3$), 2 to 15 wt % of acetic acid ($CH_3COOH$), 0.1 to 15 wt % of aluminum nitrate ($Al(NO_3)_3$), and deionized water for the residual quantity.

The etchant may further comprise a surfactant.

When signal lines are made of Al, problems caused by size increasing of an LCD, such as signal delay, are significantly improved. However, since Al may diffuse to other layers, a Mo-containing layer is formed on the Al layer to intercept the Al diffusion.

However, multi-layered signal lines also have problems. Profile degradation of signal lines, such as undercut or overhang is induced due to difference of etching speed between layers of different materials and galvanic effect induced when two different metals contact.

The galvanic effect refers to a tendency of metals having different electrical potentials in an electrolyte solution to undergo an oxidation and reduction reaction When two metals having different electrical potentials are disposed in an electrolyte solution, a metal having a relatively positive potential works as a cathode and tends to be reduced, while the other metal having a relatively negative potential works as an anode and tends to be oxidized. In this case, the etching speed (eroding speed) of the cathode metal is slower than when the cathode metal is disposed alone and the etching speed of the anode metal is faster than when the anode metal is disposed alone.

Accordingly, the Al layer of multi-metal layers, including an Al layer and a Mo layer (which works as an anode) is etched much faster than the Mo layer which works as a cathode, thereby a tip type profile is formed. Such a discrepancy of etching speed increases as nitric acid ($HNO_3$), which most strongly affects etching of the Mo layer, is consumed.

Therefore, to form signal lines having good profiles, control of etching speed is required between the Al layer and the Mo layer to make a balance. For the balance, etching speed of the Al layer is required to decrease and that of the Mo layer is required to increase.

Generally, Al is etched by the reaction of following equation 1 and nitric acid included in an etchant is dissociated by the reaction of following equation 2.

$$Al \rightarrow Al^{3+} + 3e^- \qquad (1)$$

$$HNO_3 \rightarrow H^+ + NO_3^- \qquad (2)$$

Here, to decrease the etching speed of Al, forward reaction of equation 1 should be minimized. To preserve content of nitric acid ($HNO_3$), forward reaction of equation 2 should also be minimized.

For this purpose, an etchant according to an embodiment of the present invention comprises aluminum nitrate ($Al(NO_3)_3$) as well as phosphoric acid ($H_3PO_4$), nitric acid ($HNO_3$), an acetic acid ($CH_3COOH$).

Aluminum nitrate ($Al(NO_3)_3$) is dissociated into positive aluminum ion ($Al^{3+}$) and negative nitrate ion ($NO_3^-$) by the reaction of following equation 3.

$$Al(NO_3)_3 \rightarrow Al^{3+} + 3NO_3^- \qquad (3)$$

The positive aluminum ion ($Al^{3+}$) and negative nitrate ion ($NO_3^-$) restrain the forward reactions of equations 1 and 2 according to Le Chatelier's principle. Le Chatelier's principle is a chemical reaction principle stating when a variable, such as a concentration, is changed in a system in equilibrium, a reaction to remove the excess of the concentration is induced in the system.

Accordingly, when aluminum nitrate ($Al(NO_3)_3$) is contained in the etchant, the forward reaction of equation 1 is restrained due to additional aluminum ion ($Al^{3+}$) of aluminum nitrate ($Al(NO_3)_3$) and the forward reaction of equation 2 is restrained due to additional nitrate ion ($NO_3^-$) of aluminum nitrate ($Al(NO_3)_3$).

Accordingly, etching speed of Al decreases and concentration of nitric acids preserved thereby etching speed of Mo is prevented from decreasing.

An etchant of the present invention preferably contains 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

The lower boundary of phosphoric acid ($H_3PO_4$), 60 wt % is determined in consideration of a required etching speed for mass production. The upper boundary of phosphoric acid ($H_3PO_4$), 75 wt % is determined in consideration of an increase in the viscosity of the etchant. The lower boundary of nitric acid ($HNO_3$), 0.5 wt % is determined in consideration of an etching speed decrease of Mo. The upper boundary of nitric acid ($HNO_3$), 15 wt % is determined in consideration of a decrease of taper angle of signal lines. Acetic acid ($CH_3COOH$) may be present in a range from about 2 to 15 wt %, the amount is determined due to its role as a buffer component. The lower boundary of aluminum nitrate ($Al(NO_3)_3$), 0.1 wt % is determined as a minimal amount to affect an etching speed. The upper boundary of aluminum nitrate ($Al(NO_3)_3$), 15 wt % is determined in consideration since Al may be extracted and thereby impact the formation of signal lines.

Next, the photoresist pattern 40a is striped with a photoresist striper.

Figure 6A:
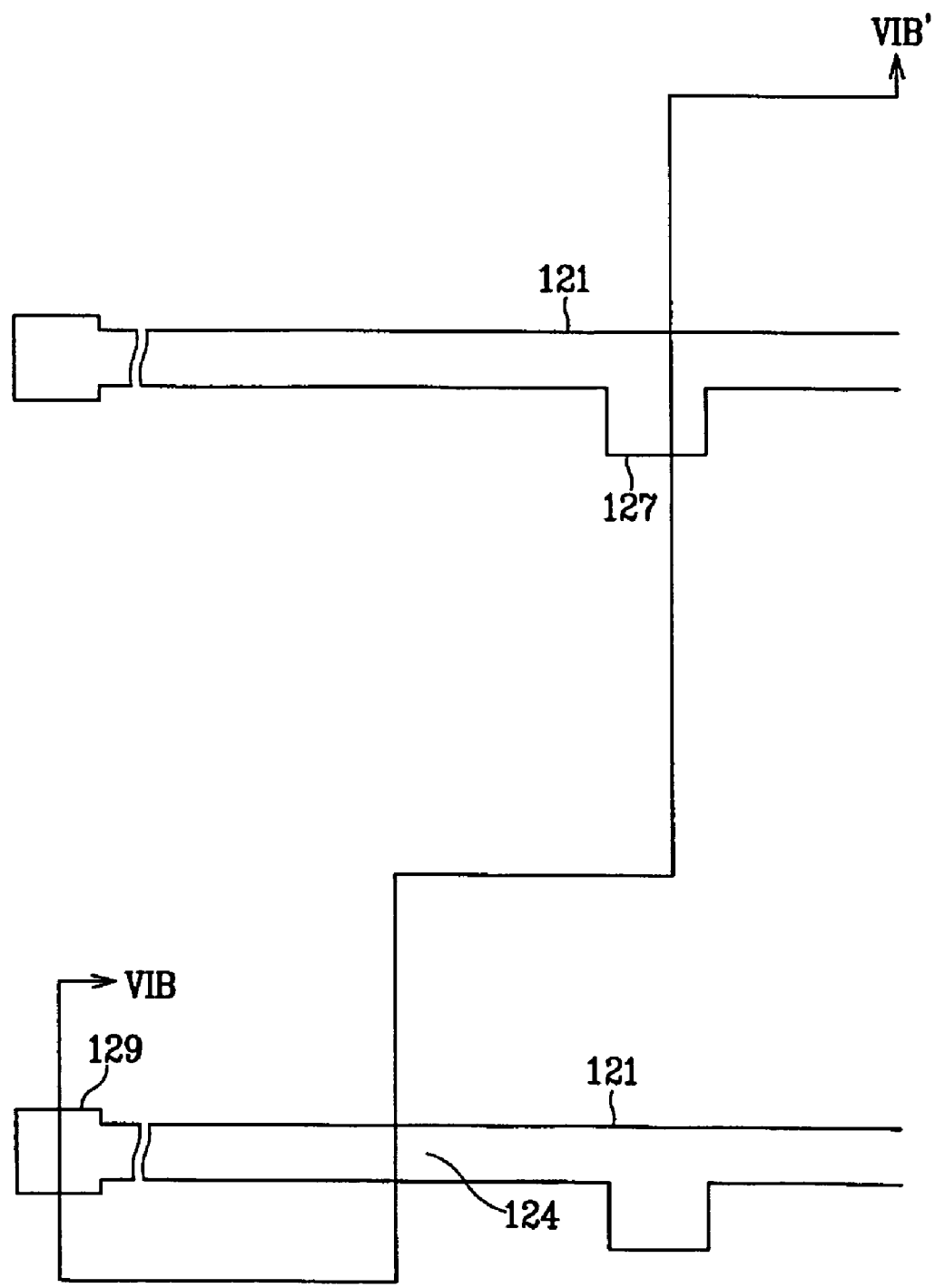
FIGS. 6A, 7A, 11A, and 12A are layout views sequentially illustrating the intermediate steps of a method of manufacturing a TFT array panel for an LCD according to the embodiment of FIGS. 1 and 2
Figure 6B:
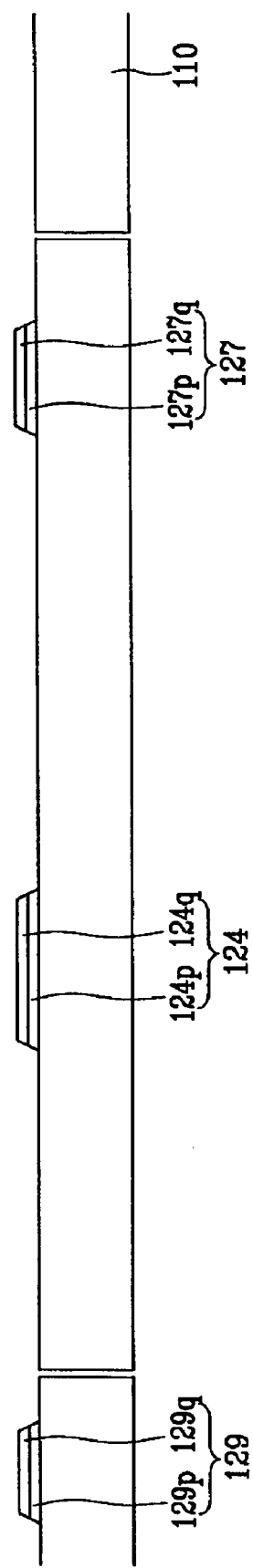

Through the above-described processes, as shown in FIGS. 6A and 6B, a plurality of gate lines 121 having a plurality of gate electrode 124 and expansions 127 are formed.

Figure 7A:
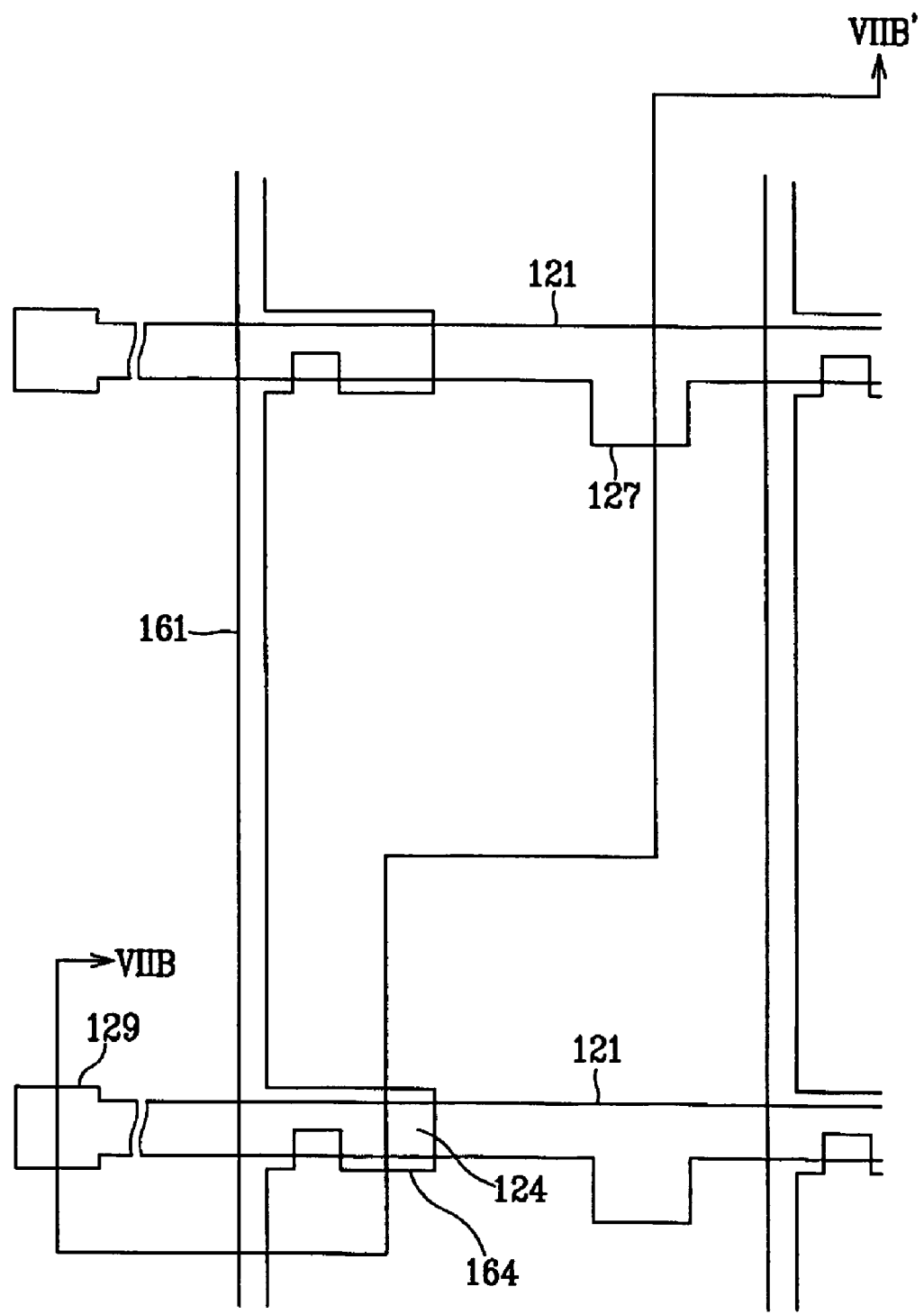
Figure 7B:
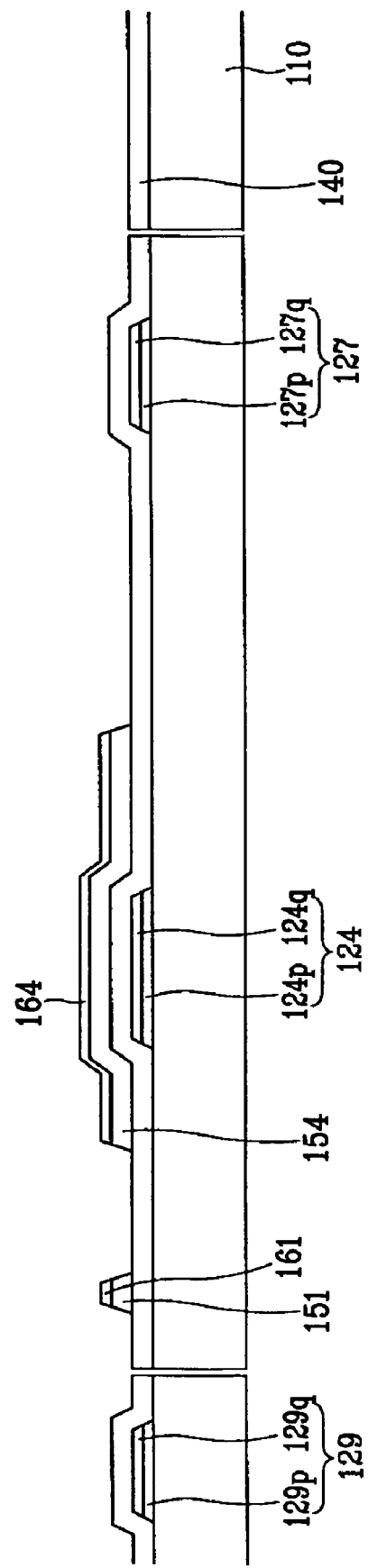

Referring to FIGS. 7A and 7B, after sequential deposition of a gate insulating layer 140, an intrinsic a-Si layer, and an extrinsic a-Si layer, the extrinsic a-Si layer and the intrinsic a-Si layer are photo-etched to form a plurality of extrinsic semiconductor stripes 161 and a plurality of intrinsic semiconductor stripes 151 respectively having projections 164, 154. The gate insulating layer 140 is preferably made of silicon nitride with a thickness of about 2,000 Å to about 5,000 Å, and the deposition temperature is preferably in a range between about 250° C. and about 500° C.

Figure 8:
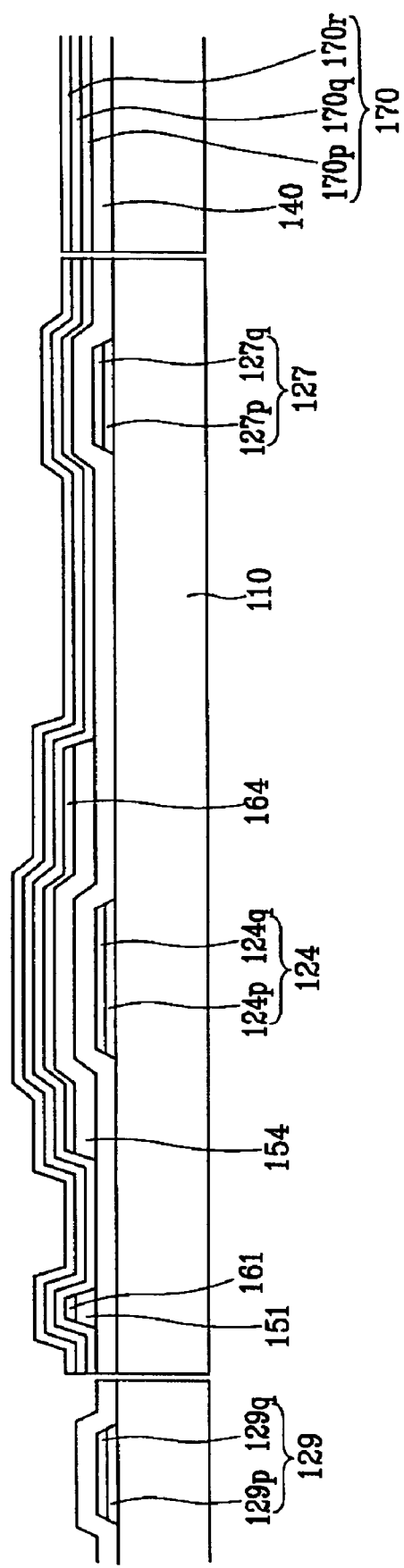

Next, as shown in FIG. 8, a first layer 170p of Mo-alloy, a second layer 170q of Al (or Al-alloy), and a third layer 170r of Mo-alloy are sequentially deposited on the extrinsic semiconductor stripes 161. The thicknesses of the first to third layers 170p, 170q, and 170r are respectively 200 to 1,000 Å, 2,000 to 4,000 Å, and 200 to 1,000 Å. The sputtering temperature is preferably about 150° C.

Figure 9:
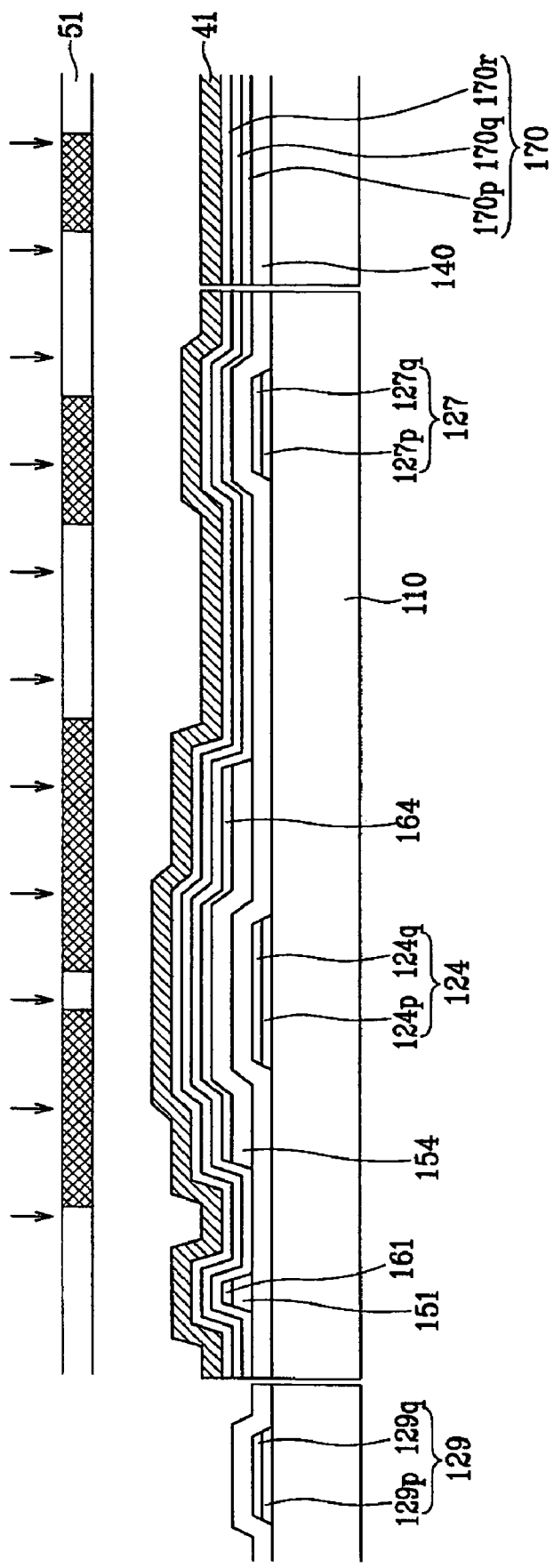

Next, as shown in FIG. 9, a photoresist layer 41 is spin-coated on the third metal layer 170r and is exposed to a light through a photomask 51. Then, the photoresist layer 41 is developed to form a photoresist pattern 41a (as shown in FIG. 10).

Figure 10:
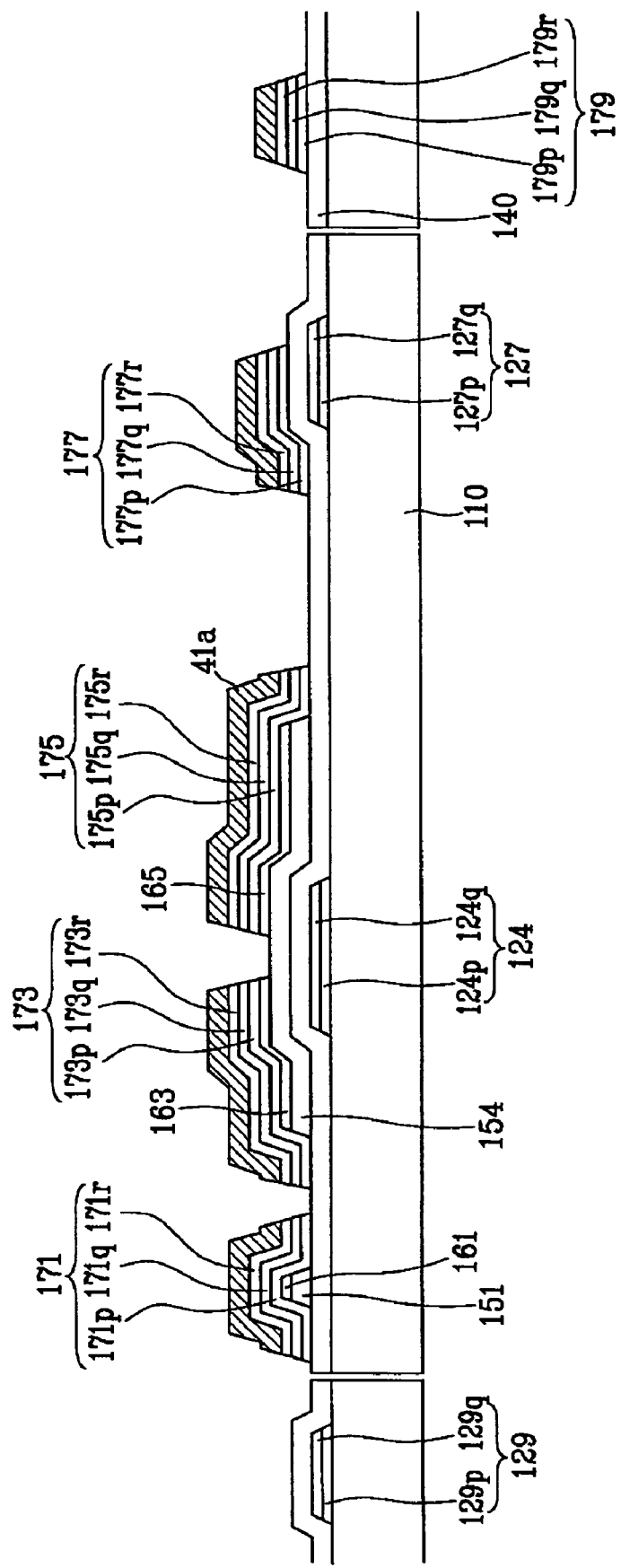

Next, as shown in FIG. 10, portions of the third to first metal layers 170, which are not covered by the photoresist pattern 41a, are etched with an etchant.

The etchant contains phosphoric acid ($H_3PO_4$), nitric acid ($HNO_3$), acetic acid ($CH_3COOH$), and aluminum nitrate ($Al(NO_3)_3$). The etchant preferably contains 60 to 75 wt % of phosphoric acid ($H_3PO_4$), 0.5 to 15 wt % of nitric acid ($HNO_3$), 2 to 15 wt % of acetic acid ($CH_3COOH$), 0.1 to 15 wt % of aluminum nitrate ($Al(NO_3)_3$), and deionized water for the residual quantity.

The etchant may further comprise a surfactant.

When signal lines are made of Al, problems caused by size increasing of an LCD, such as signal delay, are significantly improved. However, since Al may easily diffuse to other layers, a Mo-containing layer is formed on the Al layer to intercept the Al diffusion.

However, multi-layered signal lines also have problems. Profile degradation of signal lines, such as undercut or overhang is induced due to difference of etching speed between layers of different materials and a galvanic effect induced when two different metals contact.

The galvanic effect refers to a tendency of metals having different electrical potentials in an electrolyte solution to undergo an oxidation and reduction reaction. When two metals having different electrical potentials are disposed in an electrolyte solution, a metal having a relatively positive potential works as a cathode and tends to be reduced, while the other metal having a relatively negative potential works as an anode and tends to be oxidized. In this case, the etching speed (eroding speed) of the cathode metal is slower than when the cathode metal is disposed alone and the etching speed of the anode metal is faster than when the anode metal is disposed alone.

Accordingly, the Al layer of multi-metal layers, including an Al layer and a Mo layer, which works as an anode, is etched much faster than the Mo layer which works as a cathode thereby a tip type profile is formed. Such a discrepancy of etching speed increases as nitric acid ($HNO_3$), which most strongly affects on etching of the Mo layer, is consumed.

Therefore, to form signal lines having good profiles, control of etching speed is required between the Al layer and the Mo layer to make a balance. For the balance, etching speed of the Al layer is required to decrease and that of the Mo layer is required to increase.

Generally, Al is etched by the reaction of following equation 1 and nitric acid included in an etchant is dissociated by the reaction of following equation 2.

$$Al \rightarrow Al^{3+} + 3e^- \quad (1)$$

$$HNO_3 \rightarrow H^+ + NO_3^- \quad (2)$$

Here, to decrease the etching speed of Al, forward reaction of equation 1 should be minimized. To preserve content of nitric acid ($HNO_3$), forward reaction of equation 2 should also be minimized.

For this purpose, an etchant according to an embodiment of the present invention comprises aluminum nitrate ($Al(NO_3)_3$) as well as phosphoric acid ($H_3PO_4$), nitric acid ($HNO_3$), an acetic acid ($CH_3COOH$).

Aluminum nitrate ($Al(NO_3)_3$) is dissociated into positive aluminum ion ($Al^{3+}$) and negative nitrate ion ($NO_3^-$) by the reaction of following equation 3.

$$Al(NO_3)_3 \rightarrow Al^{3+} + 3NO_3^- \quad (3)$$

The positive aluminum ion ($Al^{3+}$) and negative nitrate ion ($NO_3^-$) restrain the forward reactions of equations 1 and 2 according to Le Chatelier's principle. Le Chatelier's principle is a chemical reaction principle stating when a variable, such as a concentration, is changed in a system in equilibrium, a reaction to remove the excess of the concentration is induced in the system.

Accordingly, when aluminum nitrate ($Al(NO_3)_3$) is contained in the etchant, the forward reaction of equation 1 is restrained due to additional aluminum ion ($Al^{3+}$) of aluminum nitrate ($Al(NO_3)_3$) and the forward reaction of equation 2 is restrained due to additional nitrate ion ($NO_3^-$) of aluminum nitrate ($Al(NO_3)_3$).

Accordingly, an etching speed of Al decreases, a concentration of nitric acid is preserved, and thus an etching speed of Mo is prevented from decreasing.

An etchant of the present invention preferably contains 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

Figure 11A:
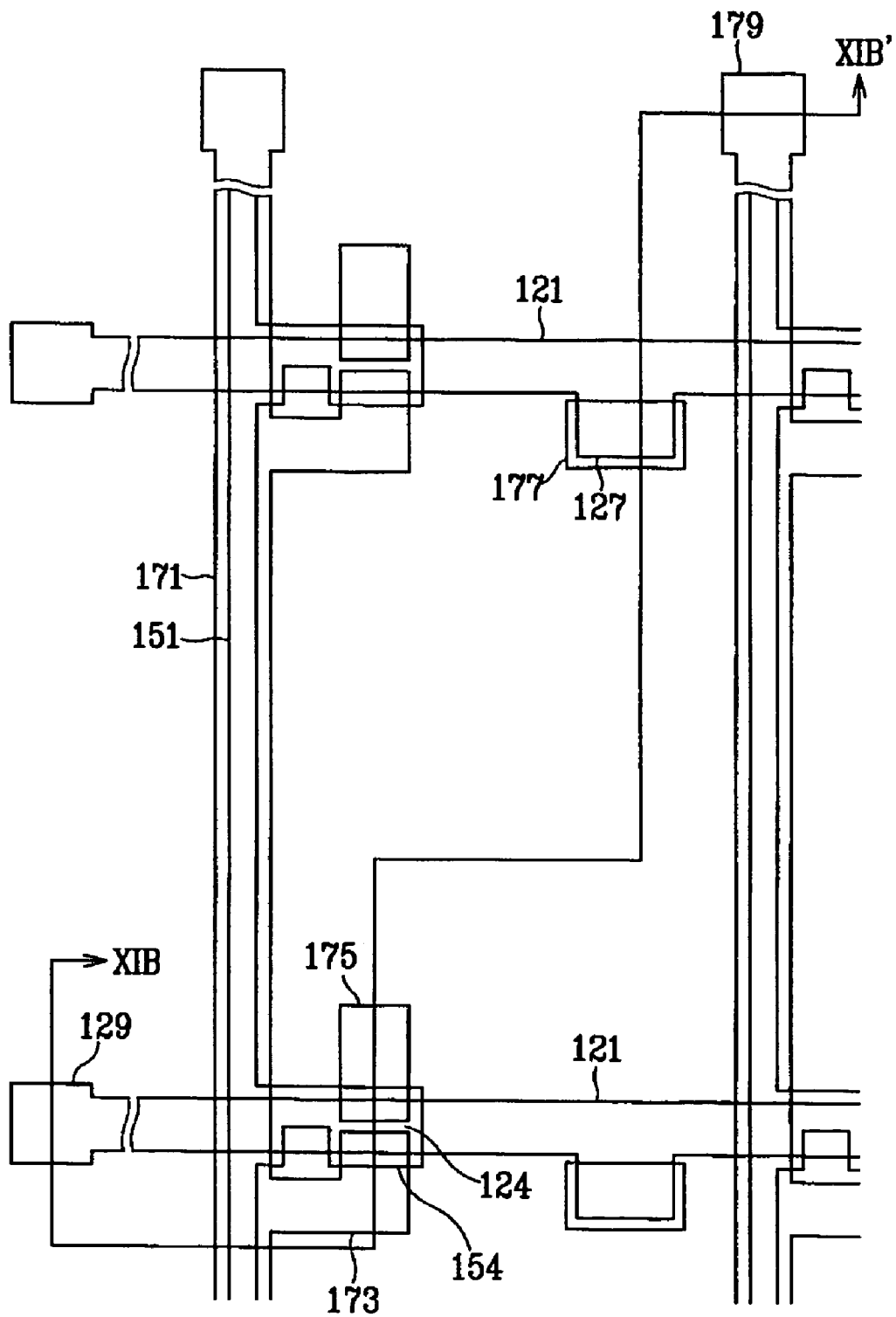
Figure 11B:
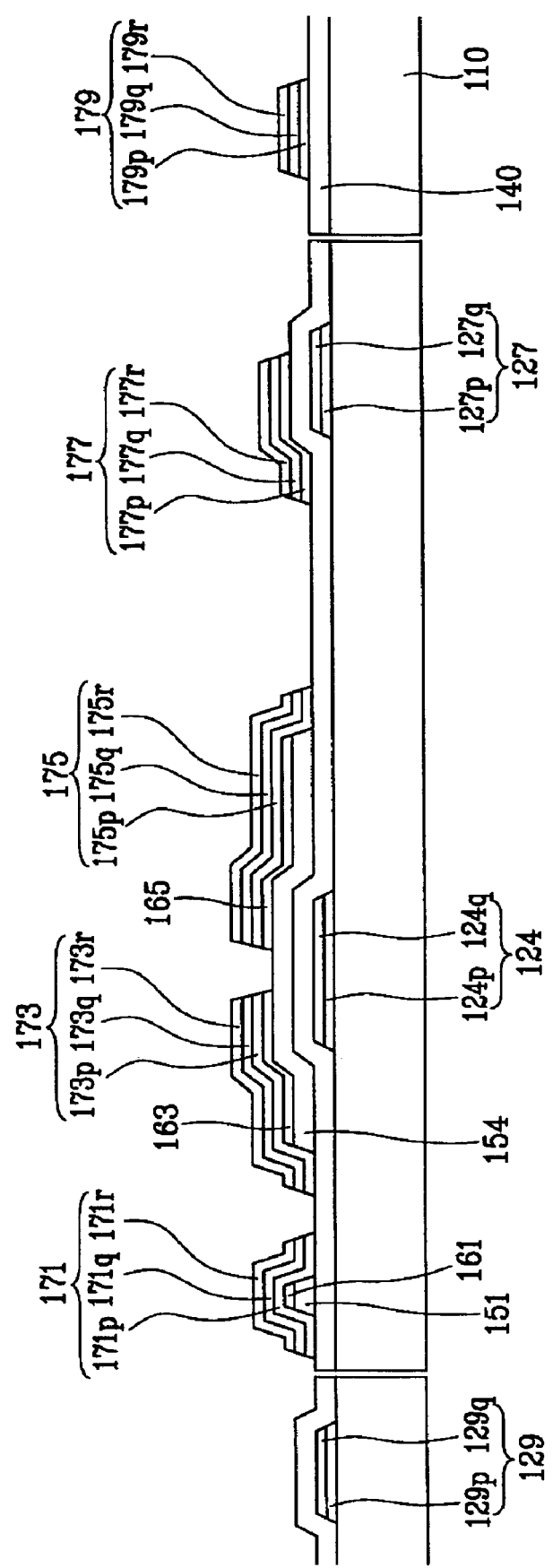

The lower boundary of phosphoric acid ($H_3PO_4$), 60 wt % is determined in consideration of a required etching speed for mass production. The upper boundary of phosphoric acid ($H_3PO_4$), 75 wt % is determined in consideration of an increase in the viscosity of the etchant. The lower boundary of nitric acid ($HNO_3$), 0.5 wt % is determined in consideration of an etching speed decrease of Mo. The upper boundary of nitric acid ($HNO_3$), 15 wt % is determined in consideration of a decrease of a taper angle of signal lines. Acetic acid ($CH_3COOH$) may be present in a range from about 2 to 15 wt %, the amount is determined due to its role as a buffer component. The lower boundary of aluminum nitrate ($Al(NO_3)_3$), 0.1 wt % is determined as a minimal amount to affect an etching speed. The upper boundary of aluminum nitrate ($Al(NO_3)_3$), 15 wt % is determined in consideration since Al may be extracted and thereby impact the formation of signal lines. Then, the photoresist pattern 41a is stripped by a photoresist stripper to form a plurality of data lines 171 having a plurality of source electrode 173, a plurality of drain electrodes 175, and storage capacitor conductors 177 as shown in FIGS. 11A and 11B.

Next, portions of the extrinsic semiconductor stripes 161, which are not covered with the data lines 171 and the drain electrodes 175, are removed by etching to complete a plurality of ohmic contacts 163, 165 and to expose portions of the intrinsic semiconductor stripes 151. Oxygen plasma treatment may follow thereafter in order to stabilize the exposed surfaces of the semiconductor stripes 151.

Figure 12A:
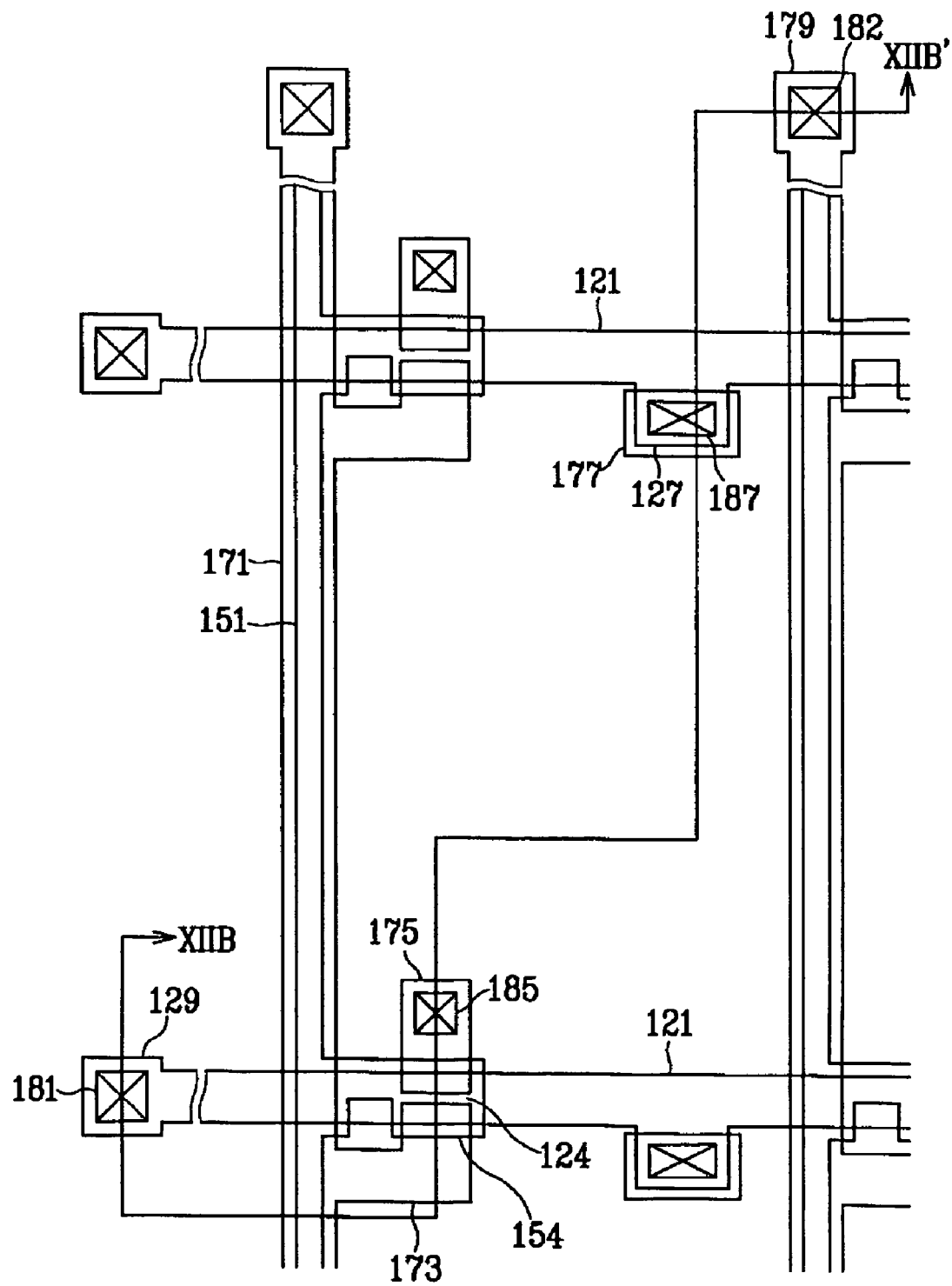
Figure 12B:
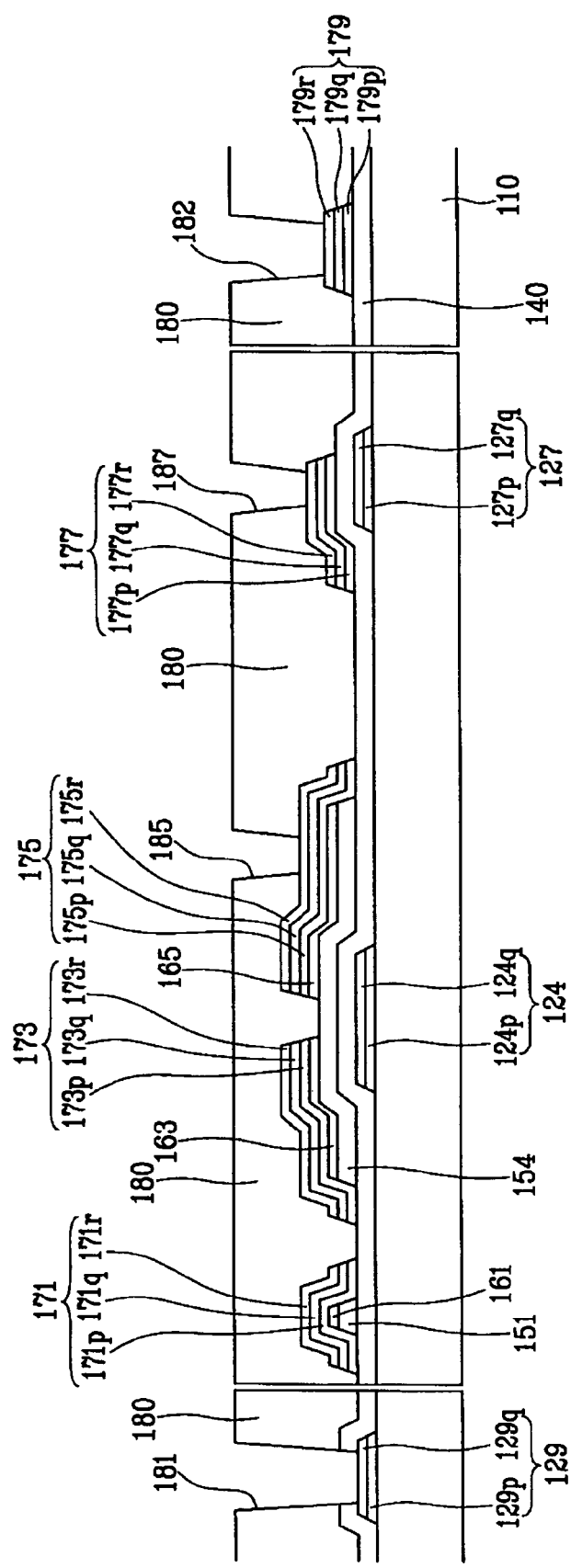

Referring to FIGS. 12A and 12B, a passivation layer 180 is deposited and dry etched along with the gate insulating layer 140 to form a plurality of contact holes 181, 185, 187, 182. The gate insulating layer 140 and the passivation layer 180 are preferably etched using etch conditions having substantially the same etch ratio for both the gate insulating layer 140 and the passivation layer 180.

When the passivation layer is made of a photosensitive material, the contact holes can be formed only by photolithography.

Finally, as shown in FIGS. 1 and 2, a plurality of pixel electrodes 190 and a plurality of contact assistants 81, 82 are formed by sputtering and photo-etching an IZO layer or an ITO layer.

Embodiment 2

The data lines and the semiconductor stripes are formed by different photo etching processes using different photo masks in Embodiment 1. However, the data lines and the semiconductor stripes may be simultaneously formed by a photo etching process using the same photo mask to reduce production costs. Such an embodiment will be described in detail with reference to the drawings.

Figure 13:
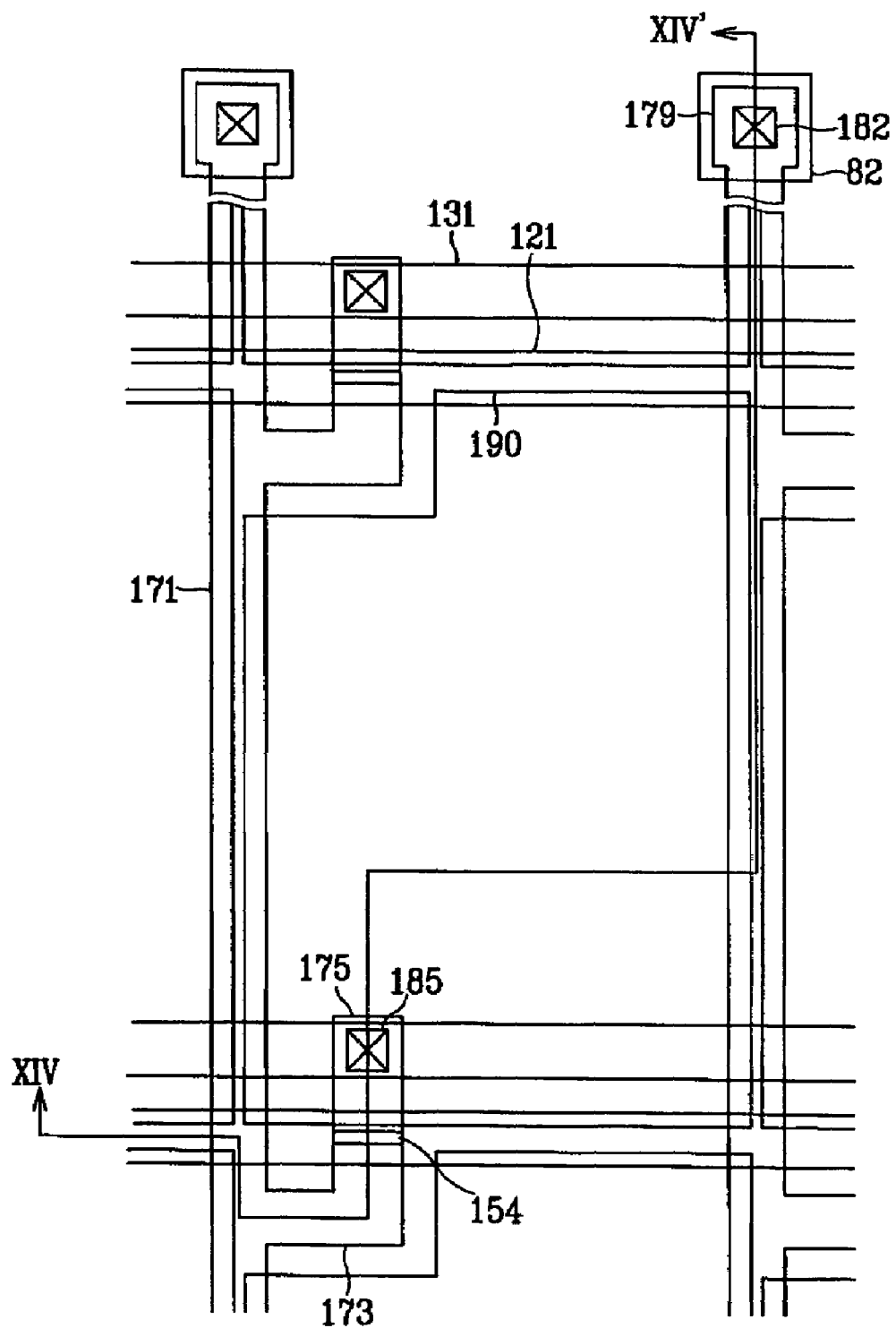
FIG. 13 is a layout view of a TFT array panel for an LCD according to another embodiment of the present invention.
Figure 14:
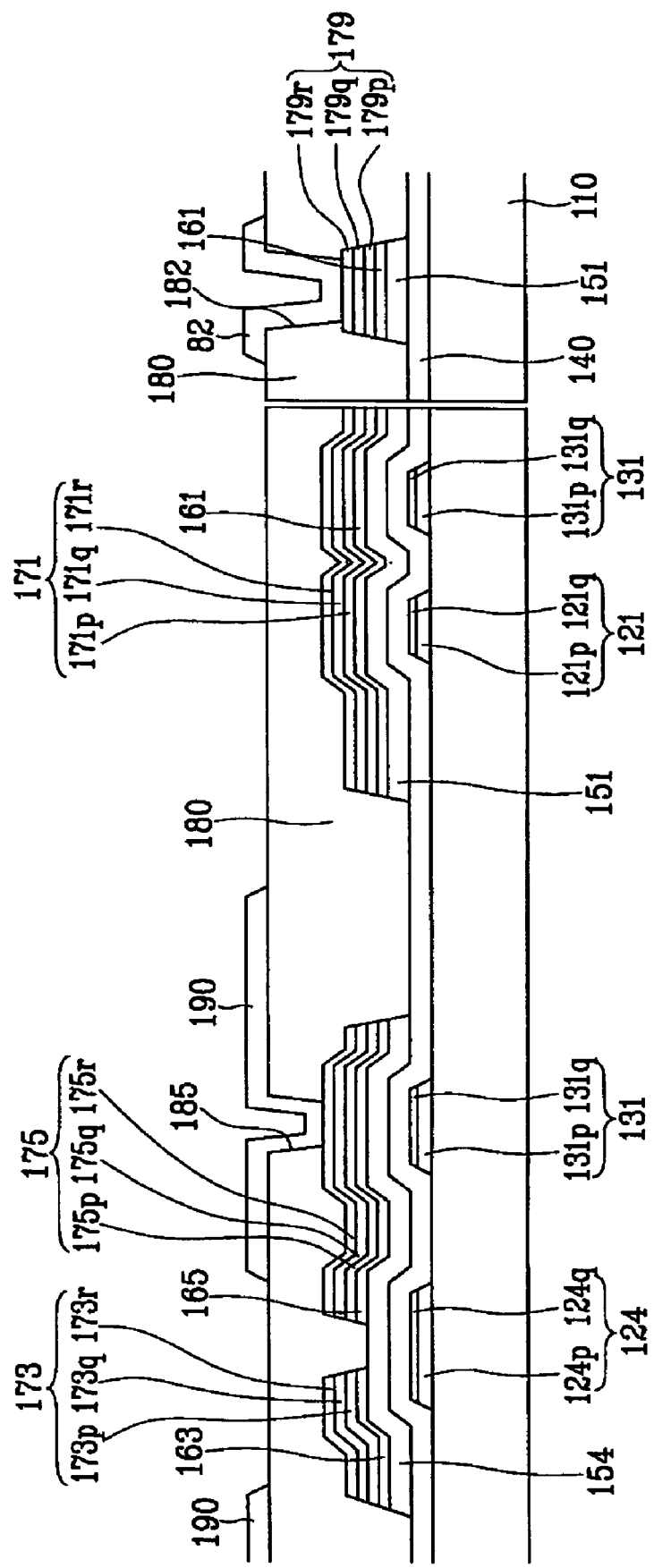
FIG. 14 is a sectional view of the TFT array panel shown in FIG. 13 taken along the line XIV-XIV'.

FIG. 13 is a layout view of a TFT array panel for an LCD according to another embodiment of the present invention and FIG. 14 is a sectional view of the TFT array panel shown in FIG. 13 taken along the line XIV-XIV'.

As seen in FIGS. 13 and 14, the layer structure of the present embodiment is very similar to that of the TFT array panel shown in FIGS. 1 and 2.

That is, gate lines 121 having gate electrodes 124 and including lower layers 121p, 124p and upper layers 121q, 124q are formed on an insulating substrate 110. A gate insulating layer 140, semiconductor stripes 151 having protrusions 154, and ohmic contacts 161, 165 are sequentially formed on the gate lines 121. A plurality of data lines 171 having source electrodes 173 and a plurality of drain electrodes 175 are formed on the ohmic contacts 161, 165 and the gate insulating layer 140. The data lines 171 and the drain electrodes 175 have three metal layers a first metal layer 171p and 175p of a Mo-containing metal, a second metal layer 171q and 175q of an Al-containing metal, and a third metal layer 171r and 175r of a Mo-containing metal. A passivation layer 180 is formed on the data lines 171 and the source electrodes 173. The passivation layer 180 has a plurality of contact holes 182, 185. A plurality of pixel electrodes 190 and a plurality of contact assistants 82 are formed on the passivation layer 180.

However, the TFT array panel according to the present embodiment includes a plurality of storage electrode lines 131 which are separated from the gate lines 121 and overlap the drain electrode 175 to form storage capacitors. The storage electrode lines 131 substitute for the expansion 127 of the TFT array panel shown in FIGS. 1 and 2.

The storage capacitors are implemented by overlapping the pixel electrodes 190 with the storage electrode lines 131. The storage electrode lines 131 are supplied with a predetermined voltage such as the common voltage. The storage electrode lines 131 may be omitted if the storage capacitance generated by the overlapping of the gate lines 121 and the pixel electrodes 190 is sufficient. The storage electrode lines 131 may be formed along a boundary of the pixels to enhance an aperture ratio.

The data lines 171 and the drain electrodes 173 have substantially the same planar pattern as the ohmic contacts 163, 165. The semiconductor stripes 151 have substantially the same planar patter with the ohmic contacts 161, 165 except the protrusions 154. The semiconductor stripes 151 have exposed portions which are not covered by the source electrodes 173 and the drain electrodes 175 and are disposed therebetween.

A method of manufacturing the TFT array panel illustrated in FIGS. 13 and 14 will now be described in detail with reference to FIGS. 15 to 22B as well as FIGS. 13 and 14.

Figure 15:
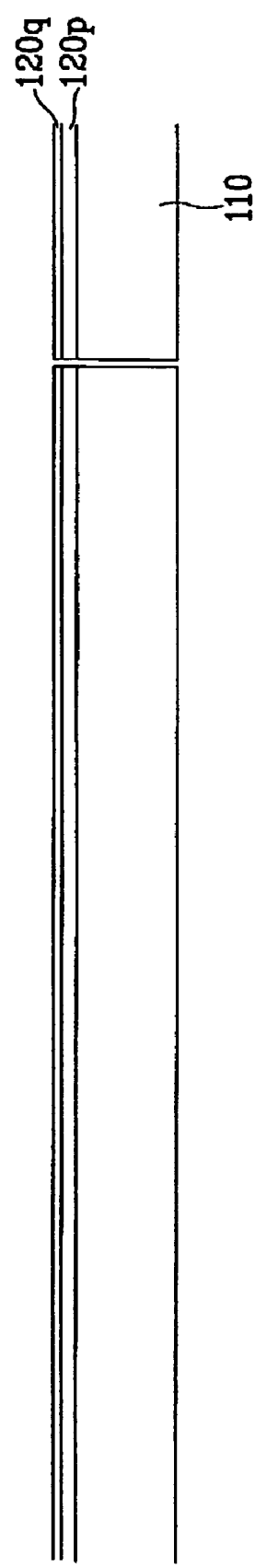

As shown in FIG. 15, a lower metal layer 120a and an upper metal layer 120b are sequentially deposited on an insulating substrate 110 by sputtering. The lower metal layer 120a is made of Al or an Al alloy. The upper metal layer 120b is made of Mo or a Mo alloy.

Figure 16:
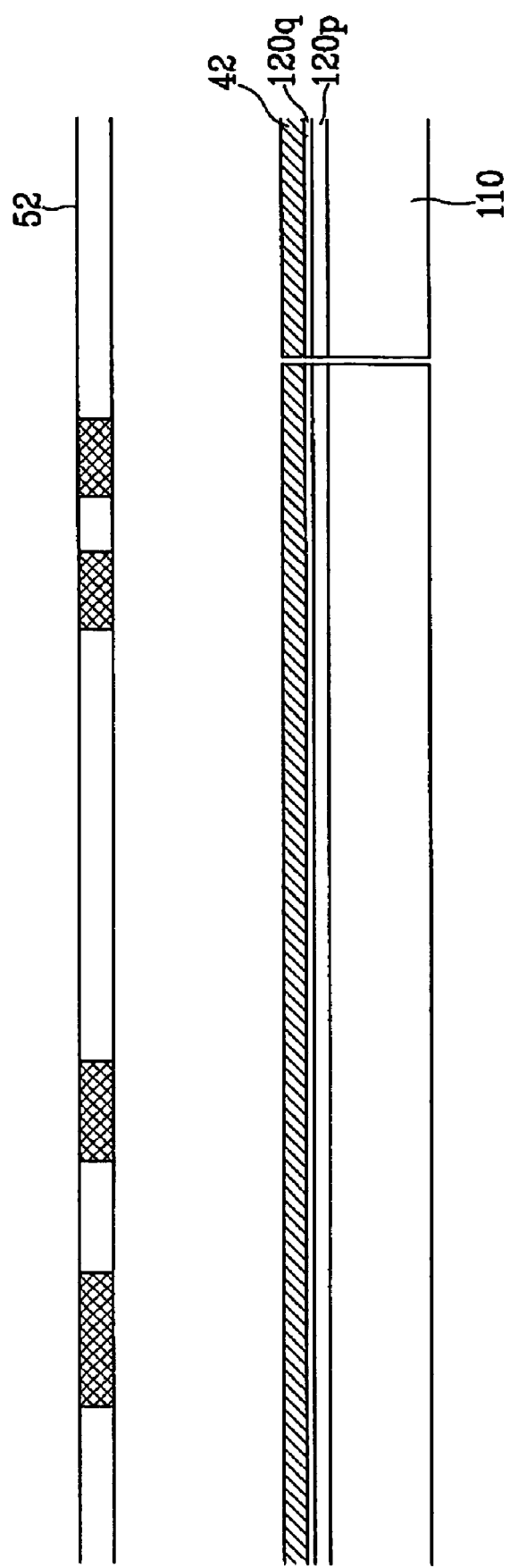

Next, as shown in FIG. 16, a photoresist layer 42 is spin-coated on the second metal layer 120b and is exposed to a light through a photomask 52. Then, the photoresist layer 42 is developed to form a photoresist pattern 42a.

Next, as shown in FIG. 17, portions of the upper metal layer 120b and the lower metal layer 120a, which are not covered by the photoresist pattern 42a, are etched with an etchant.

The etchant contains phosphoric acid ($H_3PO_4$), nitric acid ($HNO_3$), acetic acid ($CH_3COOH$), and aluminum nitrate ($Al(NO_3)_3$). The etchant preferably contains 60 to 75 wt % of phosphoric acid ($H_3PO_4$), 0.5 to 15 wt % of nitric acid ($HNO_3$), 2 to 15 wt % of acetic acid ($CH_3COOH$), 0.1 to 15 wt % of aluminum nitrate ($Al(NO_3)_3$), and deionized water for the residual quantity.

The etchant may also include a surfactant.

When signal lines are made of Al, problems caused by size increasing of an LCD, such as signal delay, are significantly improved. However, since Al may easily diffuse to other layers, a Mo-containing layer is formed on the Al layer to intercept the diffusion of Al.

However, multi-layered signal lines also have problems. Profile degradation of signal lines, such as undercut or overhang may be induced due to a difference in etching speed between layers of different materials and a galvanic effect induced when two different metals contact.

The galvanic effect refers to a tendency of metals having different electrical potentials in an electrolyte solution to undergo an oxidation and reduction reaction. When two metals having different electrical potentials are disposed in an electrolyte solution, a metal having a relatively positive potential works as a cathode and tends to be reduced, while the other metal having a relatively negative potential works as an anode and tends to be oxidized. In this case, the etching speed (eroding speed) of the cathode metal is slower than when the cathode metal is disposed alone and the etching speed of the anode metal is faster than when the anode metal is disposed alone.

Accordingly, the Al layer of multi-metal layers, including an Al layer and a Mo layer, which works as an anode, is etched much faster than the Mo layer which works as a cathode thereby a tip type profile is formed. Such a discrepancy in etching speed increases as nitric acid ($HNO_3$), which most strongly affects on etching of the Mo layer, is consumed.

Therefore, to form signal lines having good profiles, control of etching speed is required between the Al layer and the Mo layer to make a balance. For the balance, etching speed of the Al layer is required to decrease and that of the Mo layer is required to increase.

Generally, Al is etched by the reaction of following equation 1 and nitric acid included in an etchant is dissociated by the reaction of following equation 2.

$$Al \rightarrow Al^{3+} + 3e^- \quad (1)$$

$$HNO_3 \rightarrow H^+ + NO_3^- \quad (2)$$

Here, to decrease the etching speed of Al, forward reaction of equation 1 should be minimized. To preserve content of nitric acid ($HNO_3$), forward reaction of equation 2 should also be minimized.

For this purpose, an etchant according to an embodiment of the present invention comprises aluminum nitrate ($Al(NO_3)_3$) as well as phosphoric acid ($H_3PO_4$), nitric acid ($HNO_3$), an acetic acid ($CH_3COOH$).

Aluminum nitrate ($Al(NO_3)_3$) is dissociated into positive aluminum ion ($Al^{3+}$) and negative nitrate ion ($NO_3^-$) by the reaction of following equation 3.

$$Al(NO_3)_3 \rightarrow Al^{3+} + 3NO_3^- \quad (3)$$

The positive aluminum ion ($Al^{3+}$) and negative nitrate ion ($NO_3^-$) restrain the forward reactions of equations 1 and 2 according to Le Chatelier's principle. Le Chatelier's principle is a chemical reaction principle stating when a variable, such as a concentration, is changed in a system in equilibrium, a reaction to remove the excess of the concentration is induced in the system. Accordingly, when aluminum nitrate ($Al(NO_3)_3$) is contained in the etchant, the forward reaction of equation 1 is restrained due to additional aluminum ion ($Al^{3+}$) of aluminum nitrate ($Al(NO_3)_3$) and the forward reaction of equation 2 is restrained due to additional nitrate ion ($NO_3^-$) of aluminum nitrate ($Al(NO_3)_3$).

Accordingly, etching speed of Al decreases and concentration of nitric acid is preserved thereby etching speed of Mo is prevented from decreasing.

An etchant of the present invention preferably contains 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

The lower boundary of phosphoric acid ($H_3PO_4$), 60 wt % is determined in consideration of a required etching speed for mass production. The upper boundary of phosphoric acid ($H_3PO_4$), 75 wt % is determined in consideration of an increase in the viscosity of the etchant. The lower boundary of nitric acid ($HNO_3$), 0.5 wt % is determined in consideration of an etching speed decrease of Mo. The upper boundary of nitric acid ($HNO_3$), 15 wt % is determined in consideration of a decrease of a taper angle of signal lines. Acetic acid ($CH_3COOH$) may be present in a range from about 2 to 15 wt %, the amount is determined due to its role as a buffer component. The lower boundary of aluminum nitrate ($Al(NO_3)_3$), 0.1 wt % is determined as a minimal amount to affect an etching speed. The upper boundary of aluminum nitrate ($Al(NO_3)_3$), 15 wt % is determined in consideration since Al may be extracted and thereby impact the formation of signal lines.

Figure 18A:
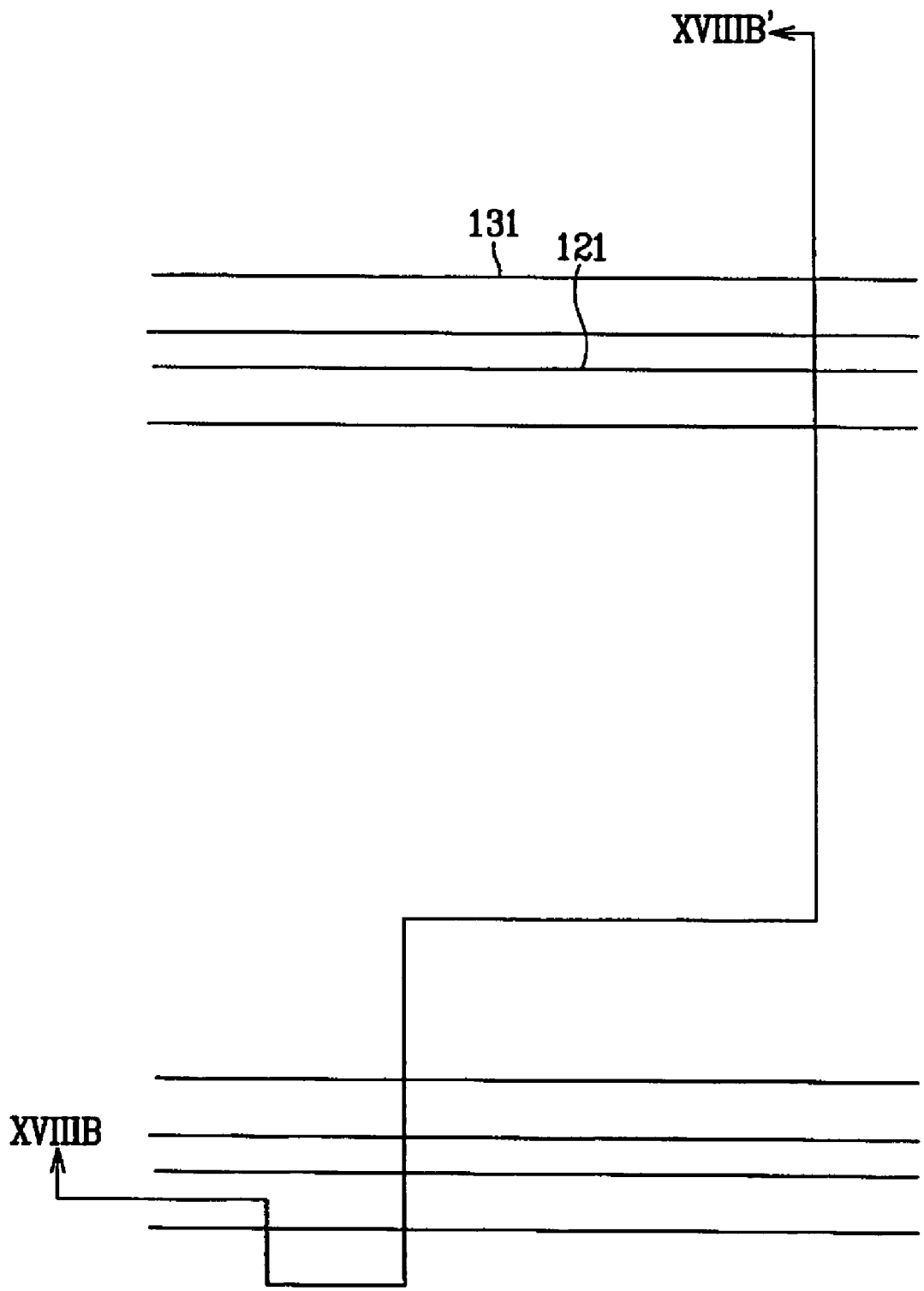
FIGS. 18A, and 22A are layout views sequentially illustrating the intermediate steps of a method of manufacturing a TFT array panel for an LCD according to the embodiment of FIGS. 13 and 14.

Then, as shown in FIGS. 18A and 18B, the photoresist pattern 42a is stripped by the photoresist stripper to complete formation of a plurality of gate lines 121 having a plurality of gate electrode 124 and a plurality of storage electrode lines 131.

Figure 19:
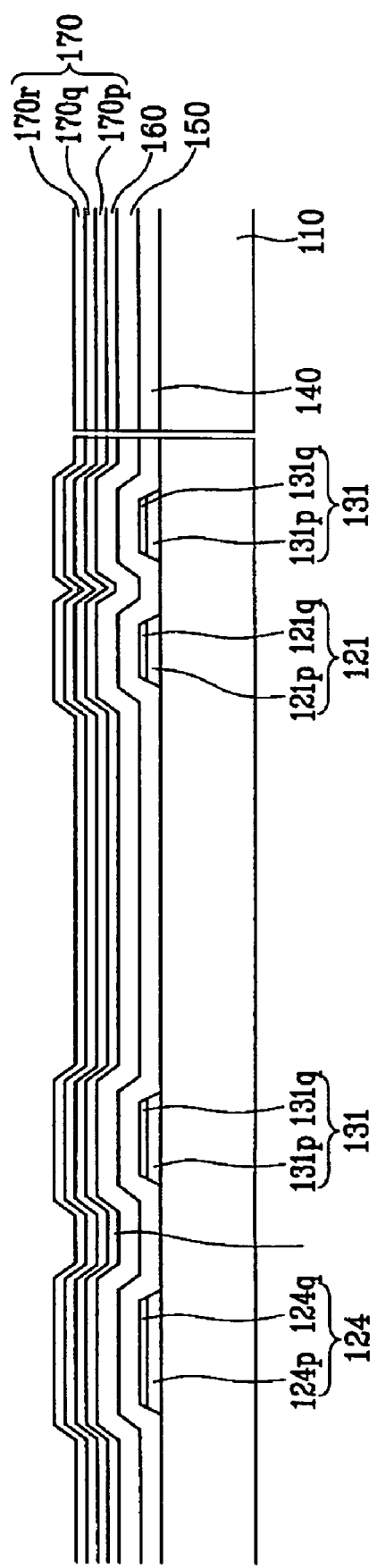
Figure 20:
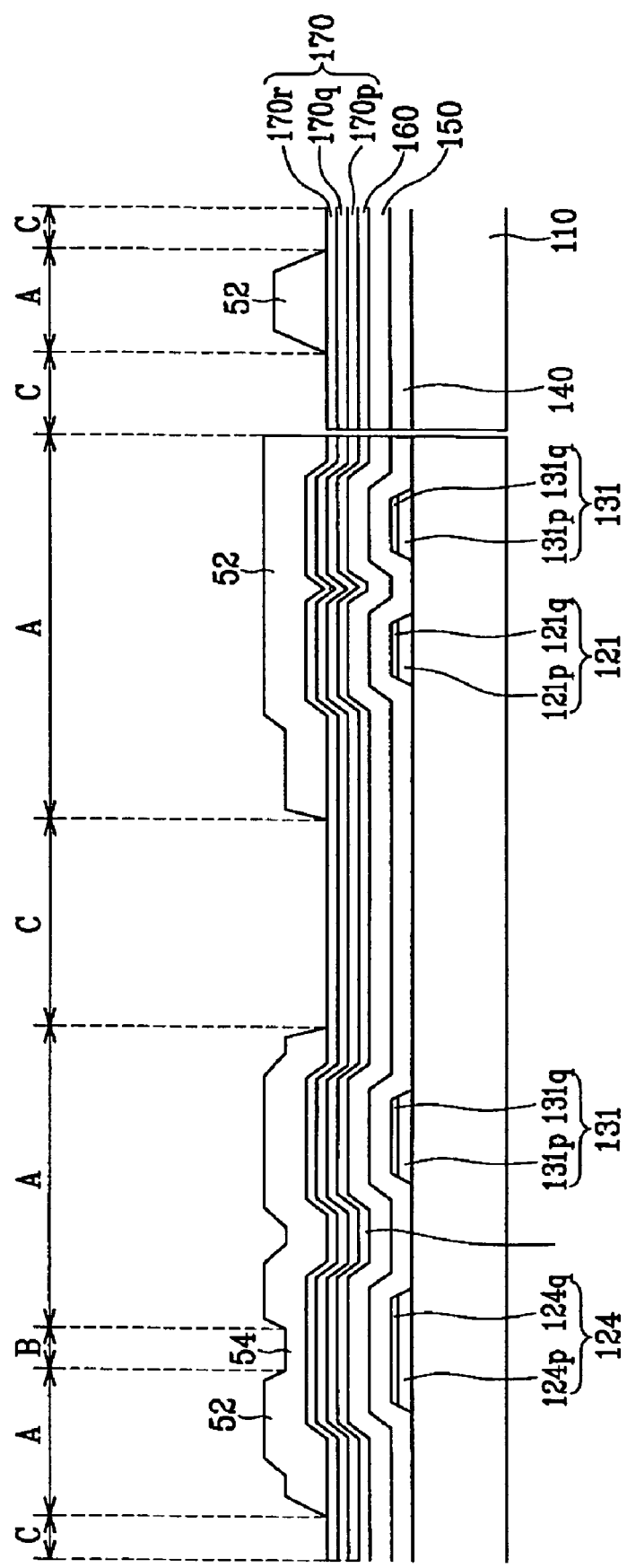

Referring to FIG. 19, a gate insulating layer 140 made of SiNx, an intrinsic semiconductor layer 150, and an extrinsic semiconductor layer 160 are sequentially deposited. The intrinsic semiconductor layer 150 is preferably made of hydrogenated amorphous silicon, and the extrinsic semiconductor layer 160 is preferably made of silicide or n+ hydrogenated a-Si heavily doped with an n-type impurity.

Next, a first layer 170p of a Mo-containing metal, a second layer 170q of an Al-containing metal, and a third layer 170r of a Mo-containing metal are sequentially deposited on the extrinsic semiconductor layer 160.

A photoresist film is coated on the third layer 170r. The photoresist film is exposed to light through a photo-mask (not shown), and developed such that the developed photoresist has a position-dependent thickness as shown in FIG. 19. The developed photoresist includes a plurality of first to third portions. The first portions 54 are located on channel areas, B, and the second portions 52 are located on the data line areas, A. No reference numerals are assigned to the third portions located on the remaining areas C since they have substantially zero thickness. Here, the thickness ratio of the first portions 54 to the second portions 52 is adjusted depending upon the process conditions in the subsequent process steps. It is preferable that the thickness of the first portions 54 is equal to or less than half the thickness of the second portions 52.

The position-dependent thickness of the photoresist is obtained by several techniques, for example, by providing translucent areas on the photomask as well as transparent areas and light blocking opaque areas. The translucent areas may have a slit pattern, a lattice pattern, or be thin film(s) with intermediate transmittance or intermediate thickness. When using a slit pattern, it is preferable that the width of the slits or the distance between the slits is smaller than the resolution of a light exposer used for the photolithography. Another example is to use a reflowable photoresist. In detail, once a photoresist pattern made of a reflowable material is formed by using a normal exposure mask with only transparent areas and opaque areas, it is subject to a reflow process to flow onto areas without the photoresist, thereby forming thin portions.

Next, the photoresist film 52 and 54 and the underlying layers are etched such that the data lines 171, drain electrodes 175, and the underlying layers are left on the data areas A, only the intrinsic semiconductor layer is left on the channel areas B, and the gate insulating layer 140 is exposed on the remaining areas C.

A method to form such a structure will now be described.

Figure 21:
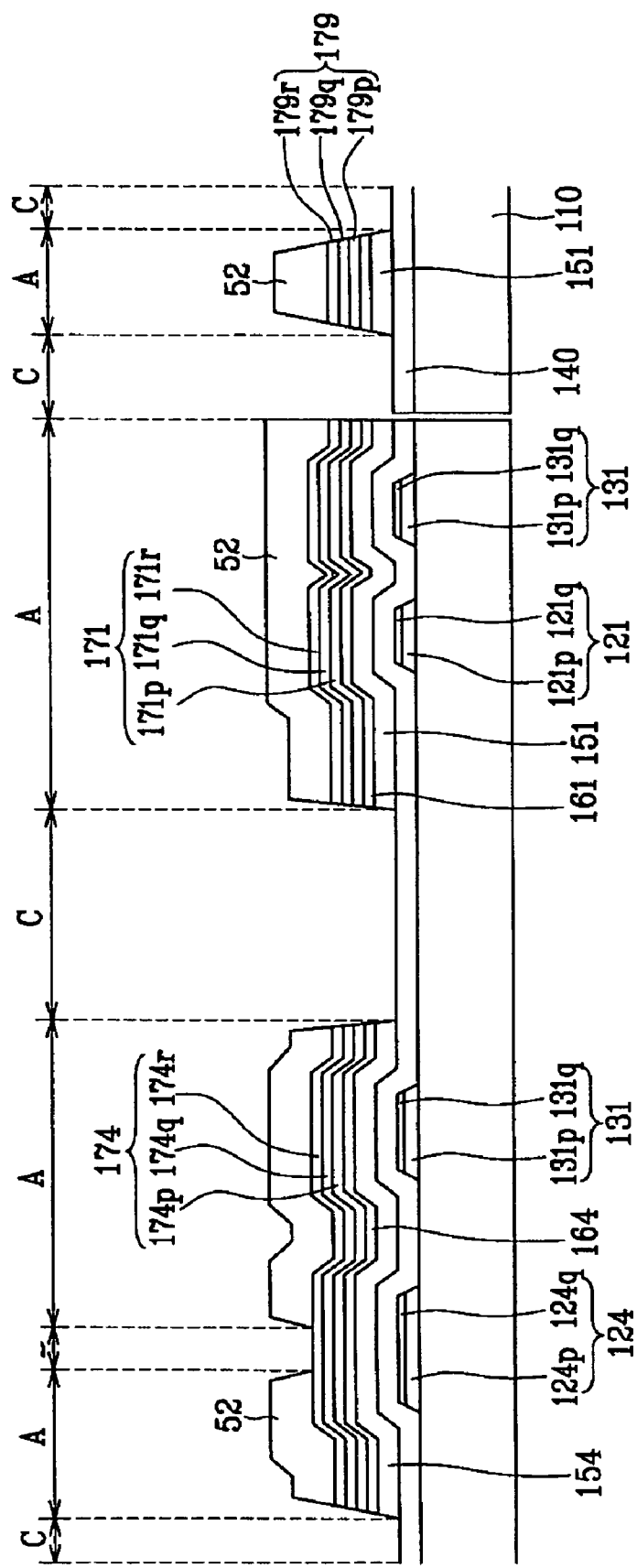

Referring to FIG. 21, the exposed portions of the first to third layers 170p, 170q, and 170r on the other areas C are etched to expose the underlying portions of the extrinsic semiconductor layer 160.

Here, the etchant contains phosphoric acid ($H_3PO_4$), nitric acid ($HNO_3$), acetic acid ($CH_3COOH$), and aluminum nitrate ($Al(NO_3)_3$). The etchant preferably contains 60 to 75 wt % of phosphoric acid ($H_3PO_4$), 0.5 to 15 wt % of nitric acid ($HNO_3$), 2 to 15 wt % of acetic acid ($CH_3COOH$), 0.1 to 15 wt % of aluminum nitrate ($Al(NO_3)_3$), and deionized water for the residual quantity.

The etchant may further comprise a surfactant.

When signal lines are made of Al, problems caused by size increasing of an LCD, such as signal delay, are significantly improved. However, since Al may easily diffusion to other layers, a Mo-containing layer is formed on the Al layer to intercept the Al diffusion.

However, multi-layered signal lines also have problems. Profile degradation of signal lines, such as undercut or overhang may be induced due to a difference in etching speed between layers of different materials and a galvanic effect induced when two different metals contact.

The galvanic effect refers to a tendency of metals having different electrical potentials in an electrolyte solution to undergo an oxidation and reduction reaction. When two metals having different electrical potentials are disposed in an electrolyte solution, a metal having a relatively positive potential works as a cathode and tends to be reduced, while the other metal having a relatively negative potential works as an anode and tends to be oxidized. In this case, the etching speed (eroding speed) of the cathode metal is slower than in a case where the cathode metal is disposed alone and the etching speed of the anode metal is faster than in a case where the anode metal is disposed alone.

Accordingly, the Al layer of multi-metal layers, including an Al layer and a Mo layer, which works as an anode, is etched much faster than the Mo layer which works as a cathode thereby a tip type profile is formed. This discrepancy in etching speed increases as nitric acid ($HNO_3$), which most strongly affects etching of the Mo layer, is consumed.

Therefore, to form signal lines having good profiles, control of etching speed is required between the Al layer and the Mo layer to make a balance. For the balance, etching speed of the Al layer is required to decrease and that of the Mo layer is required to increase.

Generally, Al is etched by the reaction of following equation 1 and nitric acid included in an etchant is dissociated by the reaction of following equation 2.

$$Al \rightarrow Al^{3+} + 3e^- \quad (1)$$

$$HNO_3 \rightarrow H^+ + NO_3^- \quad (2)$$

To decrease the etching speed of Al, forward reaction of equation 1 should be minimized. To preserve content of nitric acid ($HNO_3$), forward reaction of equation 2 should also be minimized.

For this purpose, an etchant according to an embodiment of the present invention comprises aluminum nitrate ($Al(NO_3)_3$) as well as phosphoric acid ($H_3PO_4$), nitric acid ($HNO_3$), an acetic acid ($CH_3COOH$).

Aluminum nitrate ($Al(NO_3)_3$) is dissociated into positive aluminum ion ($Al^{3+}$) and negative nitrate ion ($NO_3^-$) by the reaction of following equation 3.

$$Al(NO_3)_3 \rightarrow Al^{3+} + 3NO_3^- \quad (3)$$

The positive aluminum ion ($Al^{3+}$) and negative nitrate ion ($NO_3^-$) restrain the forward reactions of equations 1 and 2 according to Le Chatelier's principle. Le Chatelier's principle is a chemical reaction principle stating when a variable, such as a concentration, is changed in a system in equilibrium, a reaction to remove the excess of the concentration is induced in the system.

Accordingly, when aluminum nitrate ($Al(NO_3)_3$) is contained in the etchant, the forward reaction of equation 1 is restrained due to additional aluminum ion ($Al^{3+}$) of aluminum nitrate ($Al(NO_3)_3$) and the forward reaction of equation 2 is restrained due to additional nitrate ion ($NO_3^-$) of aluminum nitrate ($Al(NO_3)_3$).

Accordingly, etching speed of Al decreases and concentration of nitric acid is preserved thereby etching speed of Mo is prevented from decreasing.

An etchant of the present invention preferably contains 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

The lower boundary of phosphoric acid ($H_3PO_4$), 60 wt % is determined in consideration of a required etching speed for mass production. The upper boundary of phosphoric acid ($H_3PO_4$), 75 wt % is determined in consideration of an increase in the viscosity of the etchant. The lower boundary of nitric acid ($HNO_3$), 0.5 wt % is determined in consideration of an etching speed decrease of Mo. The upper boundary of nitric acid ($HNO_3$), 15 wt % is determined in consideration of a decrease of a taper angle of signal lines. Acetic acid ($CH_3COOH$) may be present in a range from about 2 to 15 wt %, the amount is determined due to its role as a buffer component. The lower boundary of aluminum nitrate ($Al(NO_3)_3$), 0.1 wt % is determined as a minimal amount to affect an etching speed. The upper boundary of aluminum nitrate ($Al(NO_3)_3$), 15 wt % is determined in consideration since Al may be extracted and thereby impact the formation of signal lines.

Next, the exposed portions of the extrinsic semiconductor layer 160 and the underlying portions of the intrinsic semiconductor layer 150 on the areas C as well as the photoresist pattern 54 and 52 are removed by dry etching to expose S/D metals 174 (shown in FIG. 21) of the areas B.

The photoresist pattern 54 of the channel areas B may be simultaneously removed by etching for removing the extrinsic semiconductor 160 and the intrinsic semiconductor 150, or by a separate etching process. Residual photoresist of the photoresist pattern 54 in the channel area B is removed by ashing. In this step, the semiconductor stripes 151 are completely formed.

When the data conductor layer 170 is able to be etched by dry etching, the data conductor layer 170 may be sequentially etched along with the ohmic contact layer 160 and the a-Si layer 150 to simplify manufacturing processes. In this case, the three layers 170, 160, and 150 may be sequentially etched in a dry etching chamber, which is called as "in-situ" method.

Figure 22A:
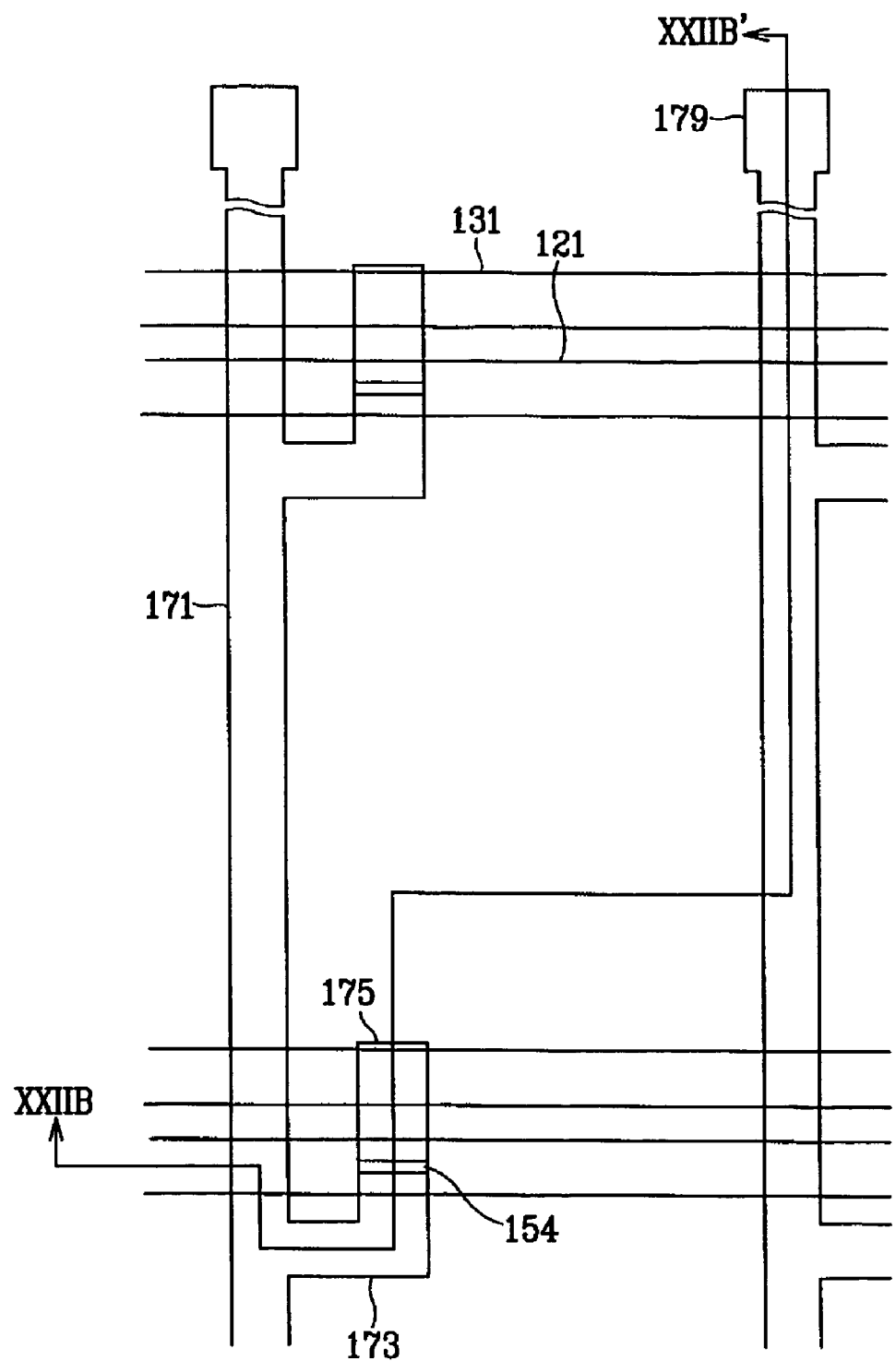
Figure 22B:
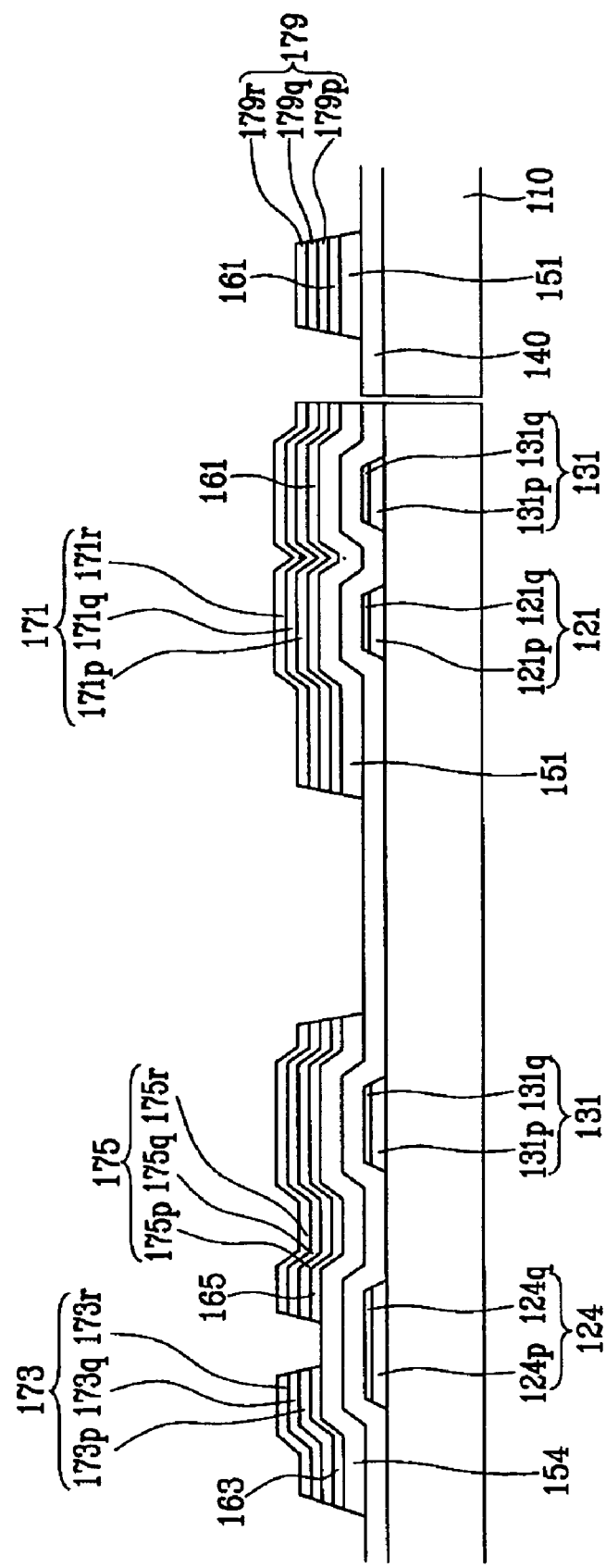

Next, as shown in FIGS. 22A and 22B, portions of the S/D metals 174 and the underlying portions of the extrinsic semiconductor layer 164 on the channel areas B are etched to be removed. At this time, the exposed portions of the semiconductor 154 may be etched to have a reduced thickness and the second portion 52 of the photoresist pattern may also be partially removed.

Then, the residual photoresist pattern 52 is stripped by a photoresist stripper.

Accordingly, the source electrodes 173 and the drain electrodes 175 are separated from each other, and, simultaneously, the data lines and the ohmic contacts 163, 165 thereunder are completed.

Through the above-described processes, as shown in FIGS. 22A and 22B, a plurality of data lines 171 having source electrodes 173, drain electrodes 175, ohmic contacts 161, 165, and semiconductor stripes 151 are formed.

Figure 23A:
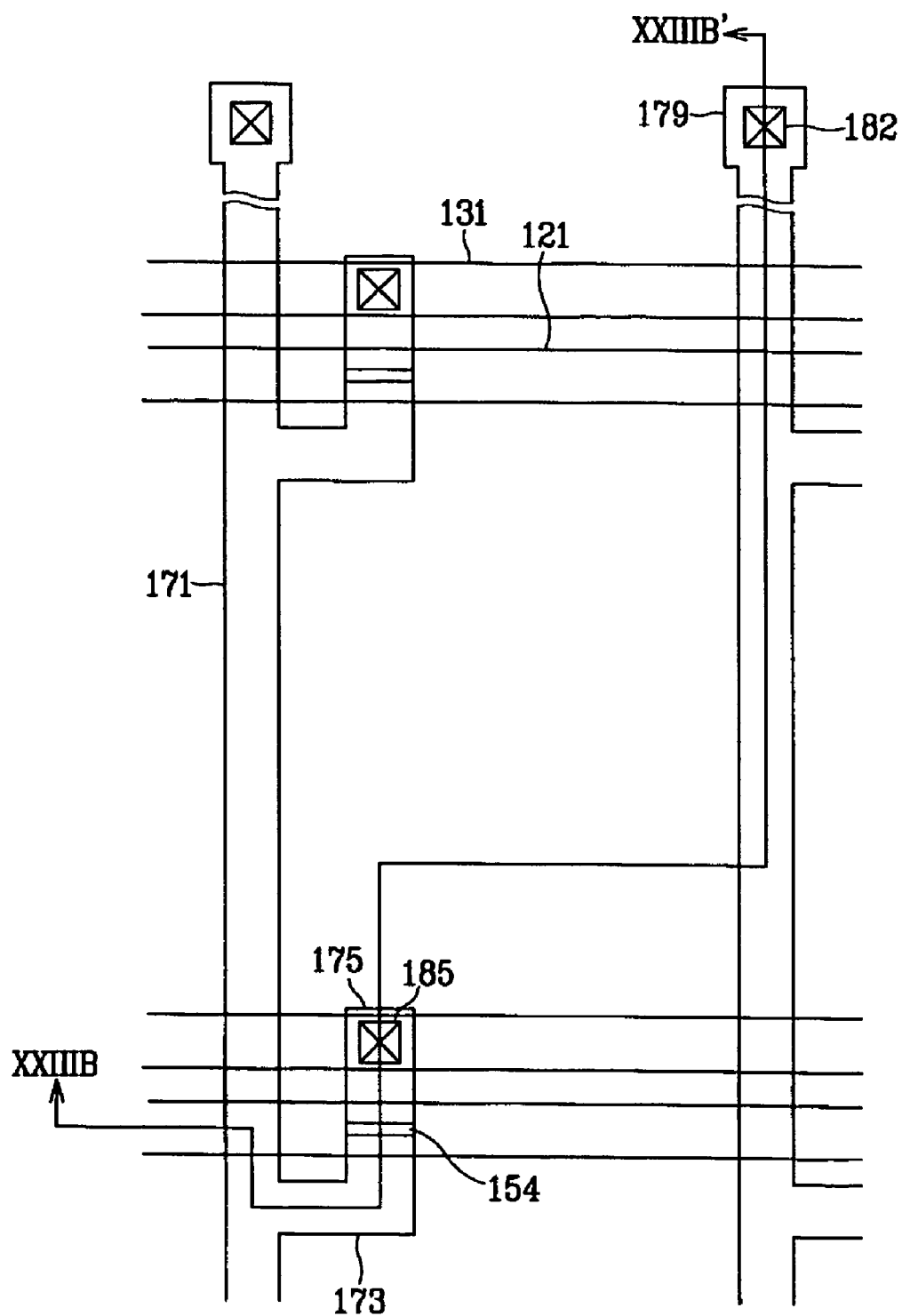
FIG. 23A is a sectional photograph showing eroded features of an Al layer by a conventional photoresist stripper.
Figure 23B:
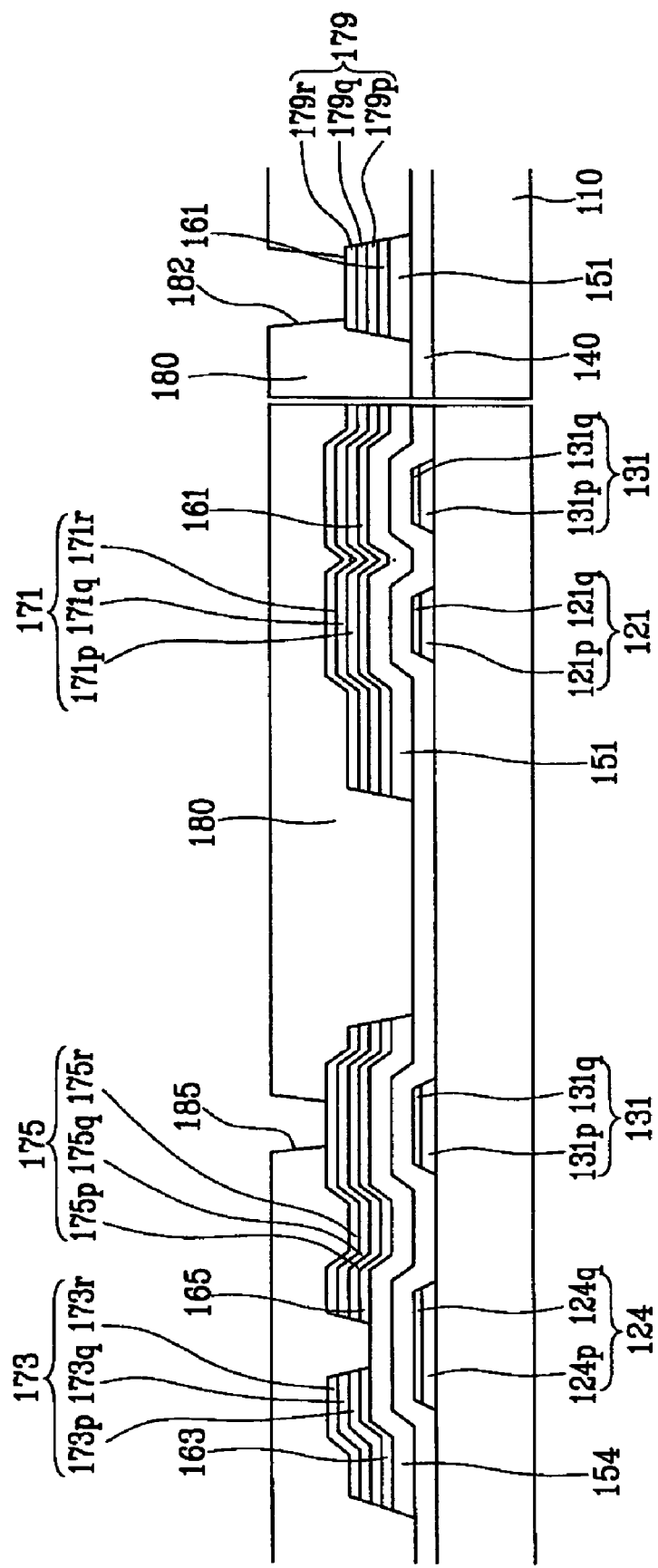
FIG. 23B is a sectional photograph showing eroded features of an Al layer by a photoresist stripper according to an embodiment of the present invention.

Thereafter, as shown in FIGS. 23A and 23B, a passivation layer 180 is formed to cover the data lines 171, the drain electrodes 175, and the exposed portions of the semiconductor stripes 151, which are not covered with the data lines 171 and the drain electrodes 175. The passivation layer 180 may be made of a photosensitive organic material having good flatness characteristics, a dielectric insulating material having a low dielectric constant of under 4.0 such as a-Si:C:O and a-Si:O:F, formed by plasma enhanced chemical vapor deposition (PECVD), or an inorganic material such as silicon nitride and silicon oxide.

Next, the passivation layer 180 is photo-etched to form a plurality of contact holes 185, 182. When the passivation layer 180 is made of a photosensitive material, the contact holes 185, 182 may be formed only by photolithography.

Finally, as shown in FIGS. 13 and 14, a plurality of pixel electrodes 190 and a plurality of contact assistants 82 are formed by sputtering and photo-etching an IZO layer or an ITO layer. The pixel electrodes 190 and the contact assistants 82 are respectively connected to the drain electrodes 175 and an end of the data lines 171 through the contact holes 185, 182.

The present invention provides an etchant containing phosphoric acid ($H_3PO_4$), nitric acid ($HNO_3$), acetic acid ($CH_3COOH$), and aluminum nitrate ($Al(NO_3)_3$) to etch the gate conductor and/or the data conductor. Accordingly, etching speeds of the Al layer and the Mo layer are controlled to allow signal lines to be formed which have a good profile.

Although preferred embodiments of the present invention have been described in detail hereinabove, it should be clearly understood that many variations and/or modifications of the basic inventive concepts herein taught, which may appear to those skilled in the present art, will still fall within the spirit and scope of the present invention, as defined in the appended claims.

What is claimed is:

1. A manufacturing method of a TFT array panel comprising:
    forming a gate line made of a conductive material on an insulating substrate;
    forming a gate insulating layer on the gate line;
    forming a semiconductor layer having a predetermined pattern on the gate insulating layer;
    forming a data line and drain electrode made of a conductive material on the semiconductor layer; and
    forming a pixel electrode connected to the drain electrode,
    wherein at least one of the formation of the gate line, the formation of the data line and drain electrode, and the formation of the pixel electrode comprises an photo-etching with an etchant containing phosphoric acid ($H_3PO_4$), nitric acid ($HNO_3$), acetic acid ($CH_3COOH$), and aluminum nitrate ($Al(NO_3)_3$).

2. The method of claim 1, wherein the etchant comprises 60 to 75 wt % of phosphoric acid ($H_3PO_4$), 0.5 to 15 wt % of nitric acid ($HNO_3$), 2 to 15 wt % of acetic acid ($CH_3COOH$), and 0.1 to 15 wt % of aluminum nitrate ($Al(NO_3)_3$).

3. The method of claim 1, wherein the gate line and the data line and drain electrode comprise a first conductive layer made of an aluminum-containing conductive material and a second conductive layer made of a molybdenum-containing conductive material.

4. The method of claim 3, wherein the first conductive layer is made of Al—Nd.

5. The method of claim 3, wherein the second conductive layer is made a Mo-alloy containing Mo and at least one metal selected from among niobium (Nb), tungsten (W), tantalum (Ta), and chromium (Cr).

6. The method of claim 3, wherein the second conductive layer is made of molybdenum nitride (MoN).

7. The method of claim 1, wherein the formation of the gate line comprises:
    sequential deposition of a first conductive layer of Al containing material and a second conductive layer of molybdenum-containing material; and
    photo-etching the second and first conductive layers.

8. The method of claim 1, wherein the formation of the data line and drain electrode comprises:
    sequential deposition of a first conductive layer of molybdenum-containing material, a second conductive layer of Al containing material, and a third layer of molybdenum-containing material; and
    photo-etching the third to first conductive layers.

9. The method of claim 8, wherein the first to third layers respectively have thicknesses of 200 to 1,000 Å, 2,000 to 4,000 Å, and 200 to 1,000 Å.

10. The method of claim 1, wherein the formation of the pixel electrode comprises:
    depositing an ITO or IZO layer; and
    photo-etching the ITO or IZO layer.

11. The method of claim 1, wherein the data line and the semiconductor layer are formed by photo-etching using a photoresist pattern having a first portion, a second portion thicker than the first portion, and a third portion thinner than the first portion.

12. The method of claim 11, wherein the first portion is disposed between the source electrode and the drain electrode, and the second portion is disposed on the data line and the drain electrode.

* * * * *